US011573279B2

(12) United States Patent
Liu et al.

(10) Patent No.: US 11,573,279 B2
(45) Date of Patent: Feb. 7, 2023

(54) DISPLACER IN MAGNETIC RESONANCE IMAGING SYSTEM

(71) Applicant: SHANGHAI UNITED IMAGING HEALTHCARE CO., LTD., Shanghai (CN)

(72) Inventors: Jianfeng Liu, Shanghai (CN); Xingen Yu, Shanghai (CN); Lijun Zou, Shanghai (CN); Jin Qian, Shanghai (CN); Yong Jiang, Shanghai (CN); Qing Ni, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 311 days.

(21) Appl. No.: 16/888,875

(22) Filed: Jun. 1, 2020

(65) Prior Publication Data
US 2020/0326396 A1    Oct. 15, 2020

Related U.S. Application Data

(63) Continuation of application No. 15/310,441, filed as application No. PCT/CN2015/091148 on Sep. 30, 2015, now Pat. No. 10,670,675.

(30) Foreign Application Priority Data

Nov. 4, 2014    (CN) .......................... 201410614194.4
Feb. 3, 2015    (CN) .......................... 201510054244.2
(Continued)

(51) Int. Cl.
*G01R 33/38*    (2006.01)
*G01R 33/3815*    (2006.01)
(Continued)

(52) U.S. Cl.
CPC ..... *G01R 33/3804* (2013.01); *G01R 33/3815* (2013.01); *H01F 6/04* (2013.01); *H01F 6/06* (2013.01)

(58) Field of Classification Search
CPC ............ G01R 33/3804; G01R 33/3815; H01F 6/04; H01F 6/06
See application file for complete search history.

(56) References Cited

U.S. PATENT DOCUMENTS 4,212,169 A    7/1980 Kneip, Jr.
4,721,934 A    1/1988 Stacy
(Continued)

FOREIGN PATENT DOCUMENTS

CN    203386560 U    1/2014
CN    103680801 A    3/2014
(Continued)

OTHER PUBLICATIONS

International Search Report in PCT/CN2015/091148 dated Jan. 27, 2016, 4 pages.
(Continued)

*Primary Examiner* — Daniel R Miller
(74) *Attorney, Agent, or Firm* — Metis IP LLC

(57) ABSTRACT

Some embodiments of the present disclosure relate to a displacer for reducing the consumption of a cryogen used in a superconductive magnet device. The displacer may occupy some space within the cryogen storage cavity or limit the cryogen into a relatively small space surrounding a superconductive coil in the cryogen storage cavity. The displacer may also include a displacer cavity that may be vacuum or contain a cryogen or another substance.

20 Claims, 25 Drawing Sheets

(30) Foreign Application Priority Data

Jul. 9, 2015 (CN) .......................... 201520490896.6
Sep. 15, 2015 (CN) .......................... 201510587181.7

(51) Int. Cl.
*H01F 6/04* (2006.01)
*H01F 6/06* (2006.01)

(56) References Cited

U.S. PATENT DOCUMENTS

| | | |
|---|---|---|
| 5,568,104 A | 10/1996 | Laskaris et al. |
| 5,701,744 A | 12/1997 | Eckels et al. |
| 6,107,905 A | 8/2000 | Itoh et al. |
| 8,269,587 B2 | 9/2012 | Inoue et al. |
| 8,319,588 B2 | 11/2012 | Calvert et al. |
| 8,487,730 B2 | 7/2013 | Hahn et al. |
| 8,598,881 B2 | 12/2013 | Jiang et al. |
| 8,643,367 B2 | 2/2014 | Huang et al. |
| 8,793,991 B2 | 8/2014 | Citver et al. |
| 8,988,176 B2 | 3/2015 | Aoki et al. |
| 2009/0302844 A1 | 12/2009 | Saito et al. |
| 2010/0295640 A1 | 11/2010 | Tamura |
| 2011/0136671 A1 | 6/2011 | Citver et al. |
| 2011/0291779 A1 | 12/2011 | Inoue et al. |
| 2012/0028805 A1 | 2/2012 | Hollis et al. |
| 2012/0176134 A1 | 7/2012 | Jiang et al. |
| 2014/0107468 A1 | 4/2014 | Calvert |
| 2015/0080222 A1 | 3/2015 | Kwon et al. |
| 2016/0103193 A1* | 4/2016 | Kwon ................ G01R 33/3804 324/322 |
| 2017/0123025 A1 | 5/2017 | Celik et al. |

FOREIGN PATENT DOCUMENTS

| | | | | |
|---|---|---|---|---|
| CN | 104700976 A | | 6/2015 | |
| GB | 2505207 A | * | 2/2014 | ............ F17C 13/007 |
| GB | 2505207 A | | 2/2014 | |
| JP | S62169311 A | | 7/1987 | |
| JP | S63117409 A | | 5/1988 | |
| JP | S63192281 A | | 8/1988 | |
| JP | H047807 A | | 1/1992 | |
| JP | 2007173460 A | | 7/2007 | |

OTHER PUBLICATIONS

Written Opinion in PCT/CN2015/091148 dated Jan. 27, 2016, 5 pages.
First Office Action in Chinese Application No. 201510587181. 7 dated Nov. 2, 2016, 7 pages.
First Office Action in Chinese Application No. 201510054244. 2 dated Jul. 4, 2016, 9 pages.
First Office Action in Chinese Application No. 201410614194. 4 dated Aug. 30, 2017, 22 pages.
Examination Report in British Application No. 1707398. 2 dated Jun. 30, 2017, 4 pages.

* cited by examiner

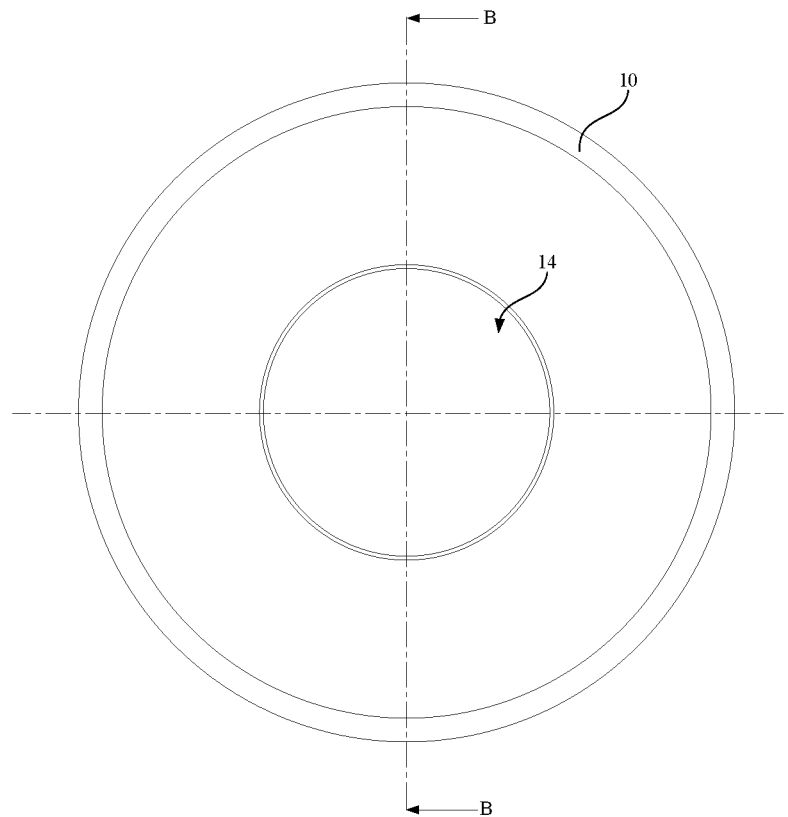
FIG. 4-A

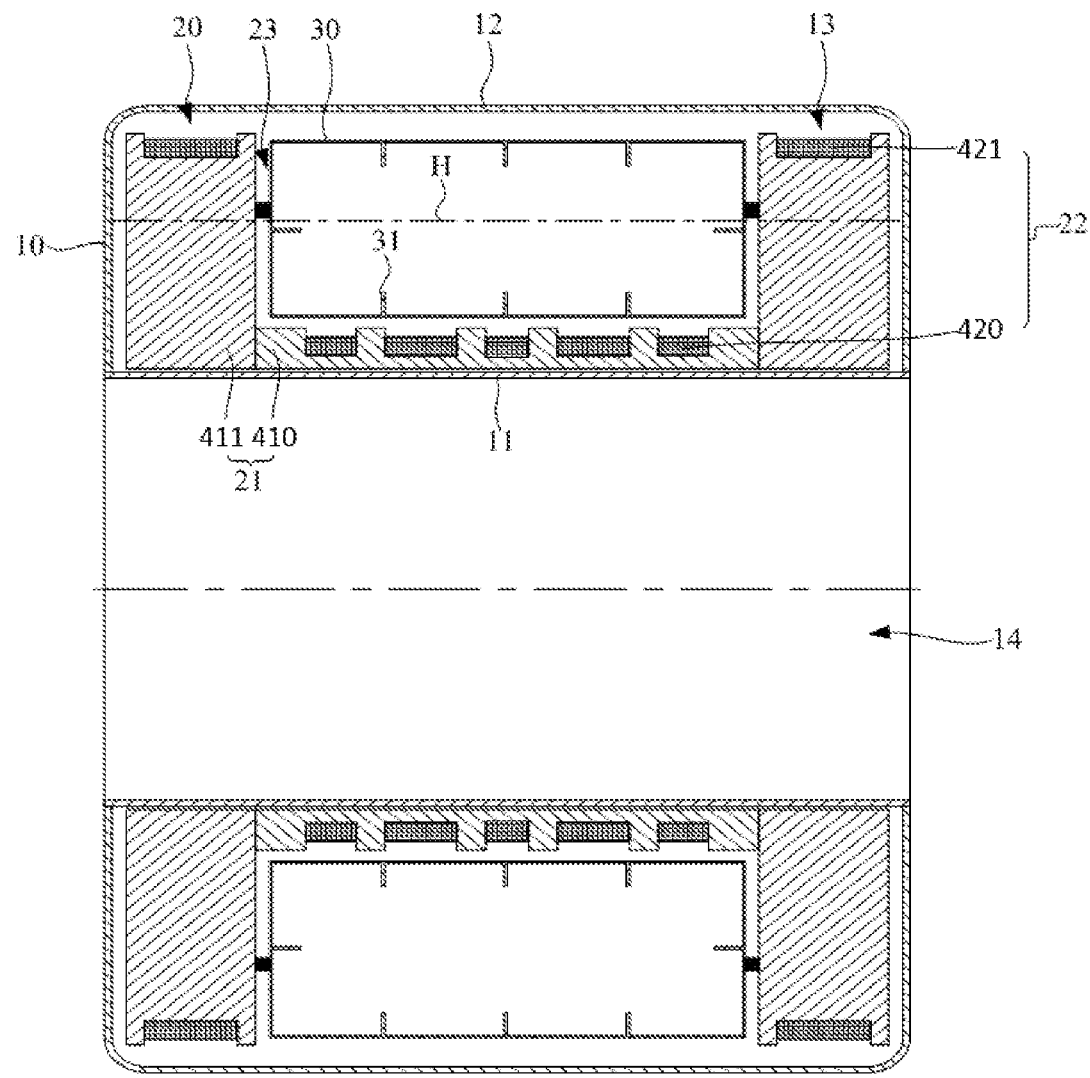
FIG. 4-B

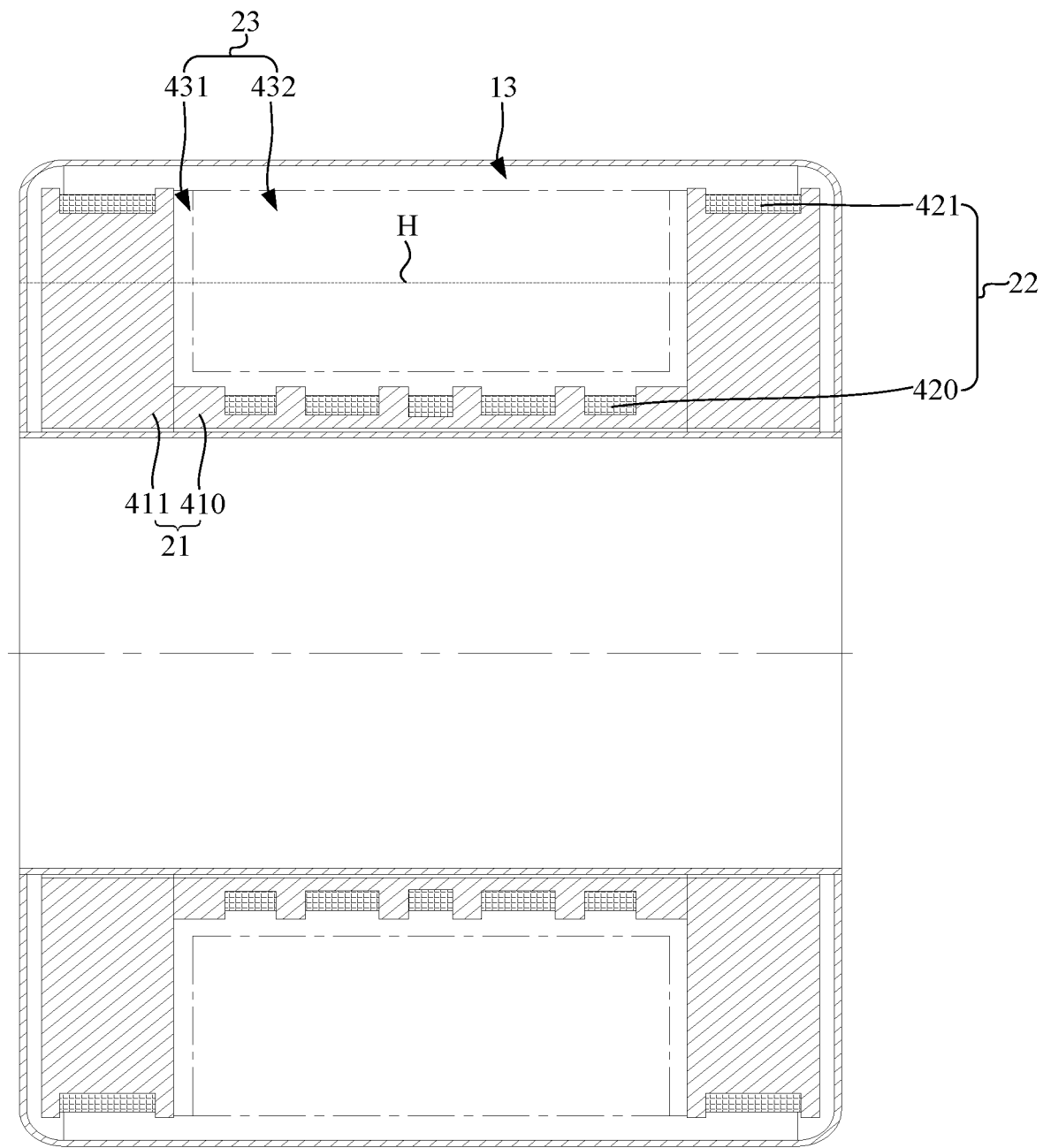
FIG. 4-C

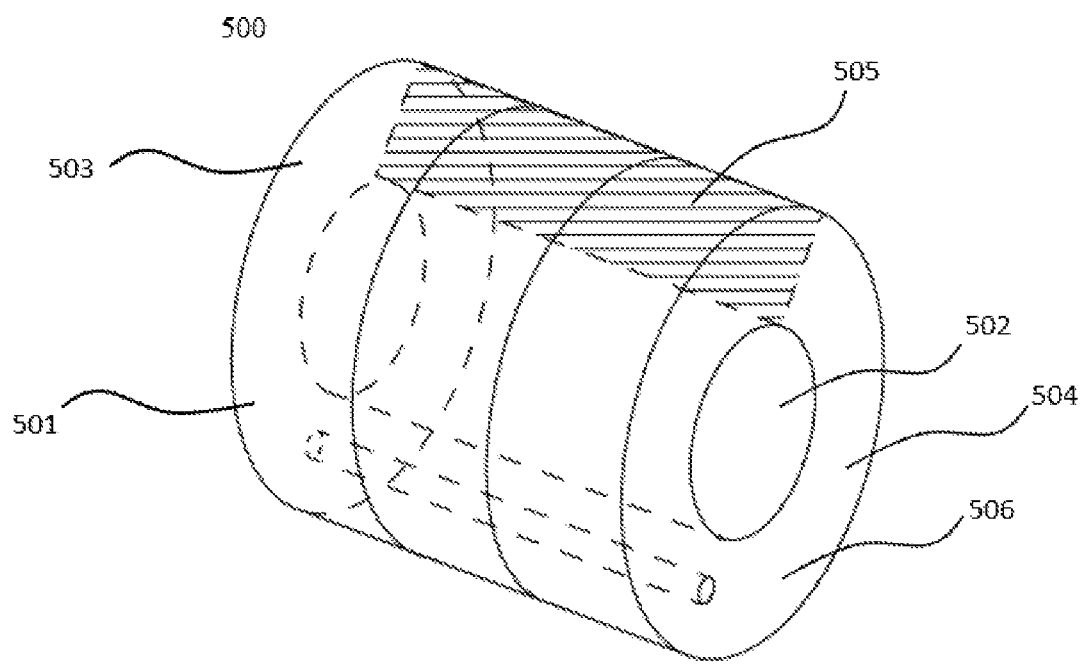
FIG. 5-A

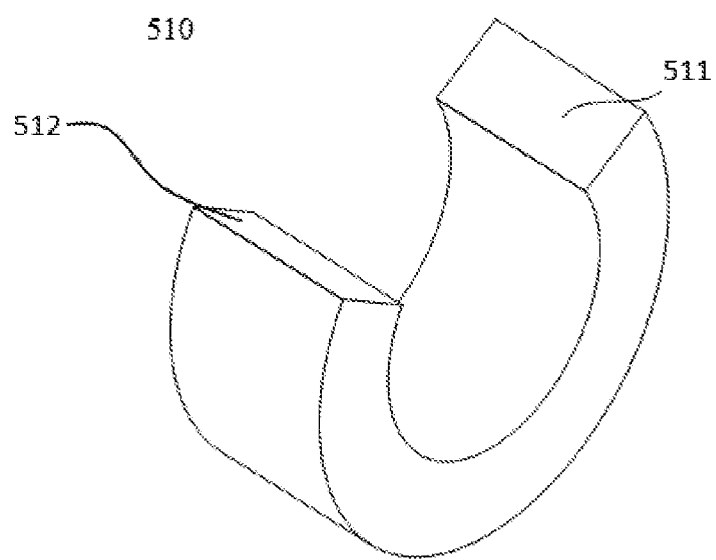
FIG. 5-B

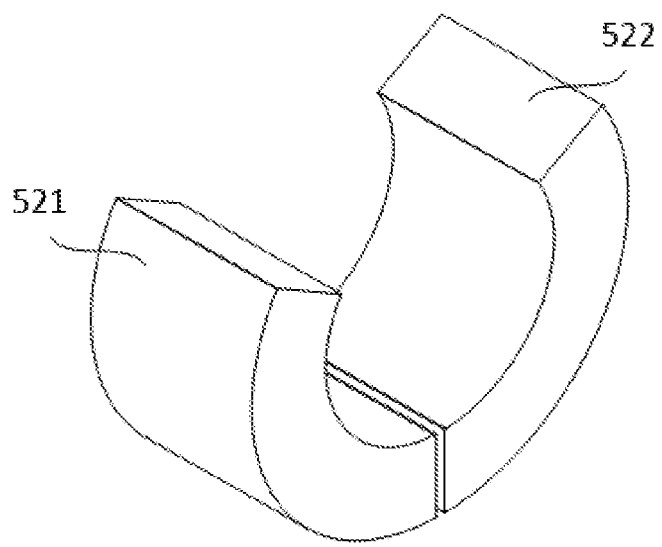
FIG. 5-C

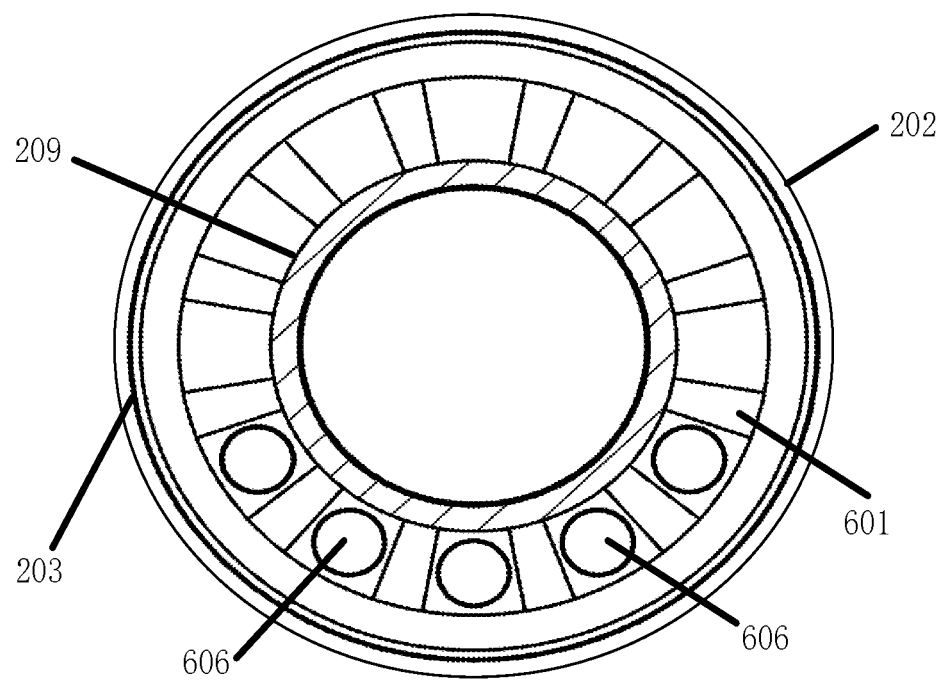
FIG. 6-A

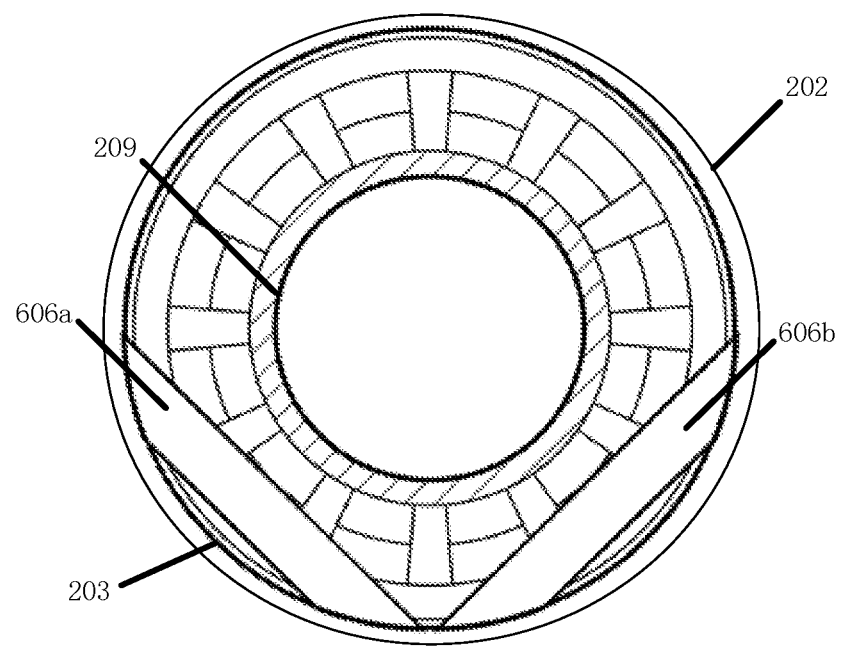
FIG. 6-B

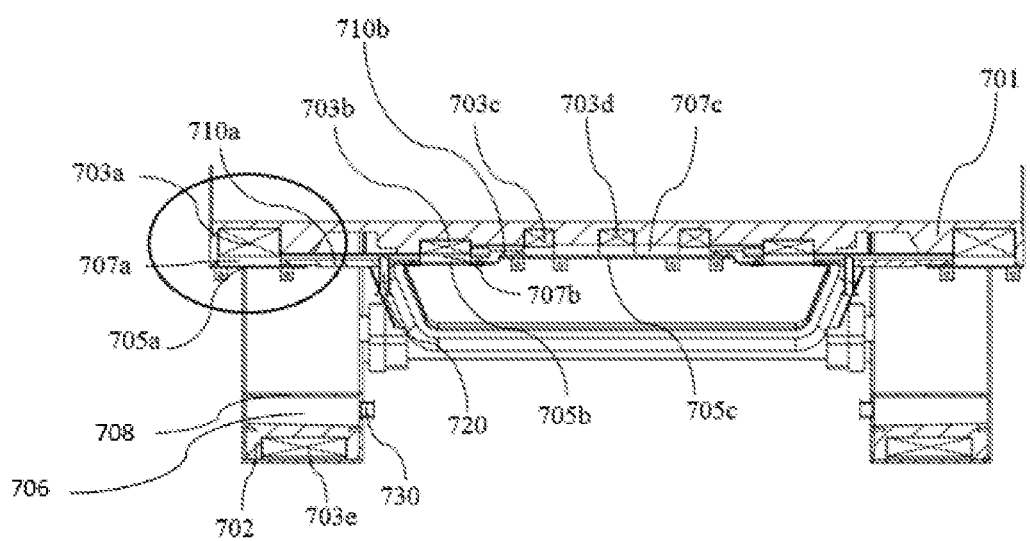
FIG. 7-A

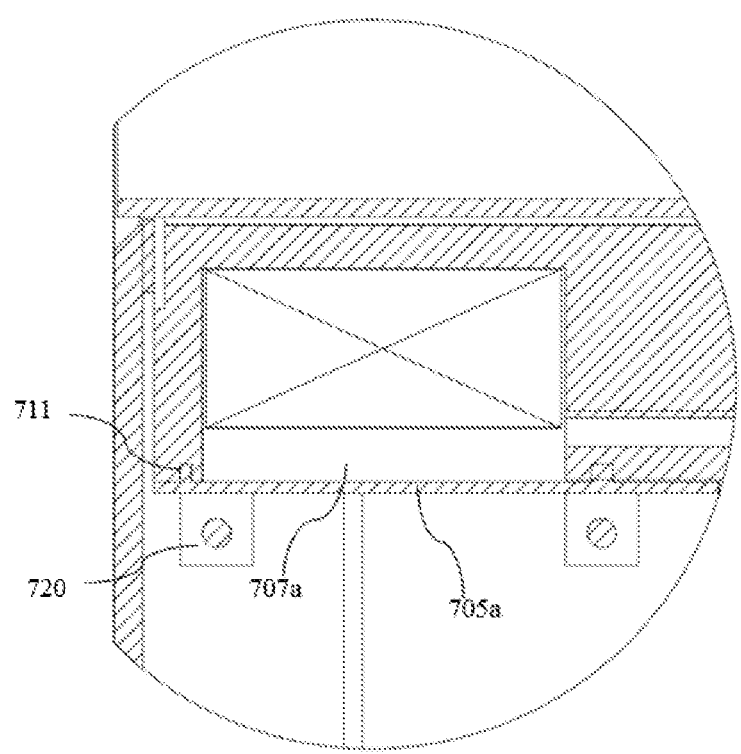
FIG. 7-B

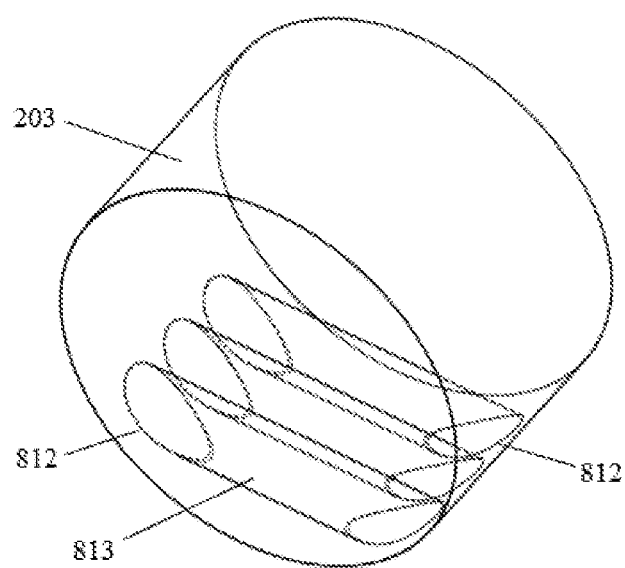
FIG. 8-A

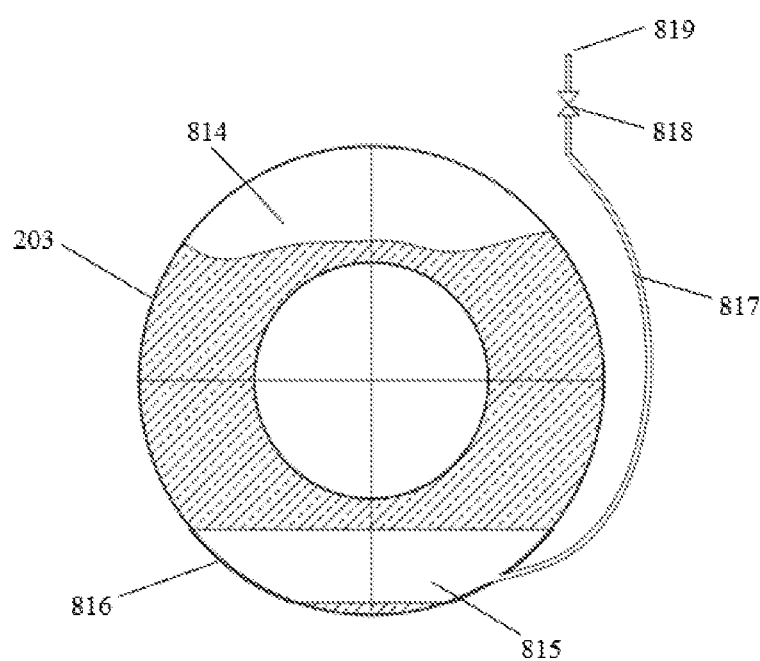
FIG. 8-B

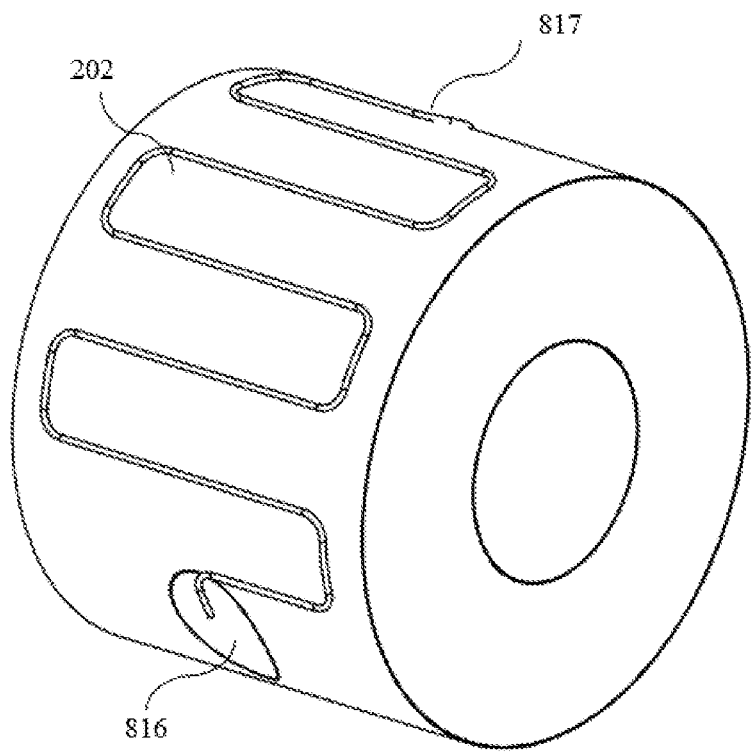
FIG. 8-C

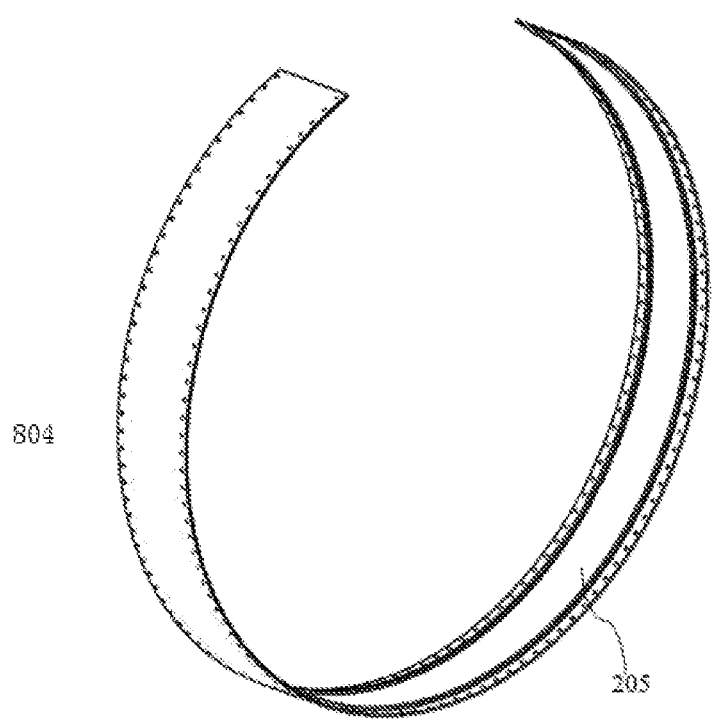
FIG. 8-D

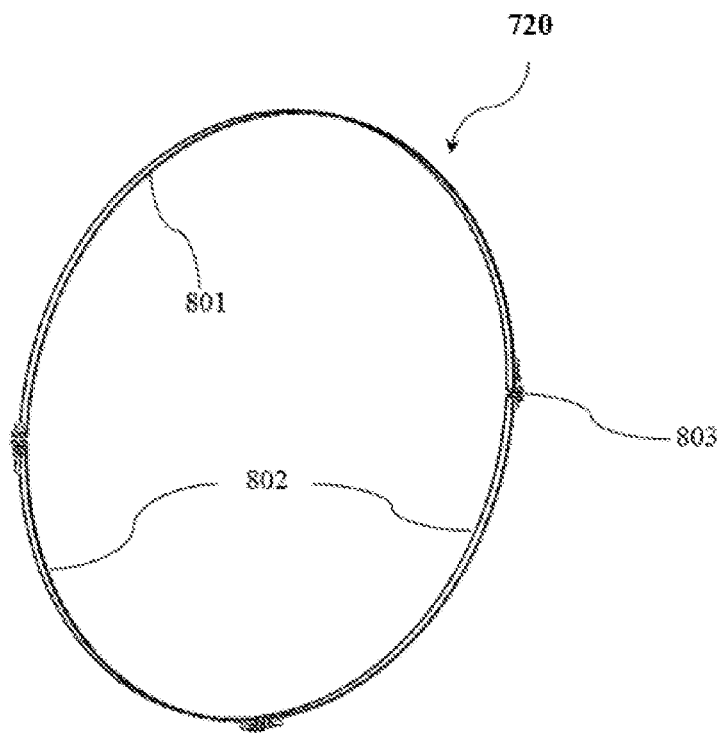
FIG. 8-E

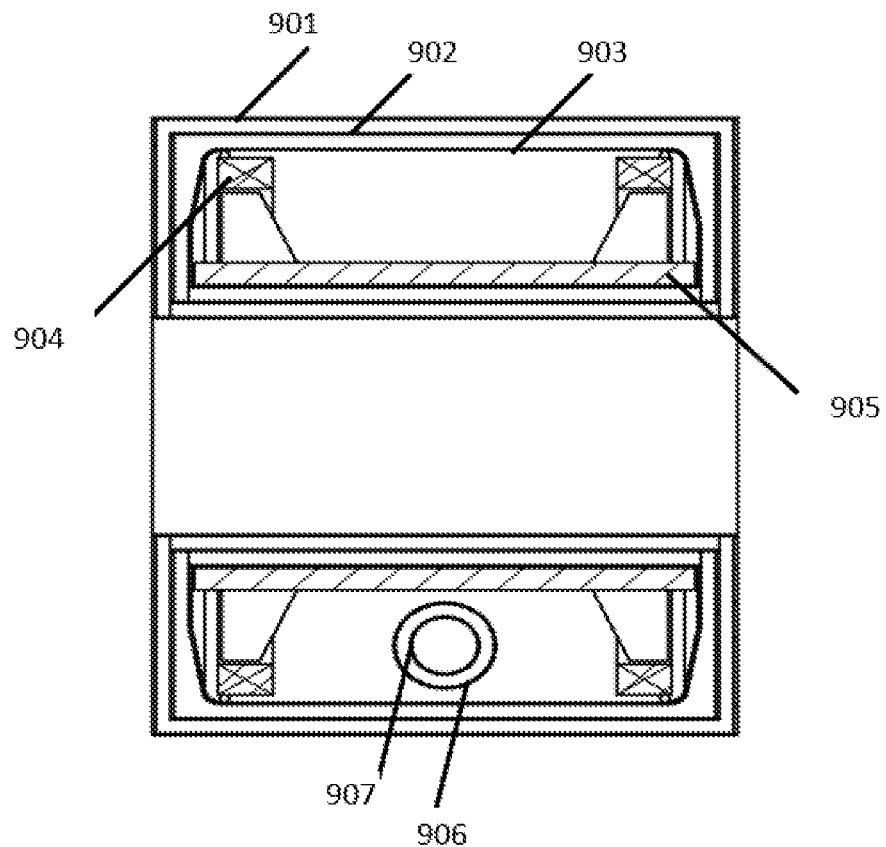
FIG. 9-A

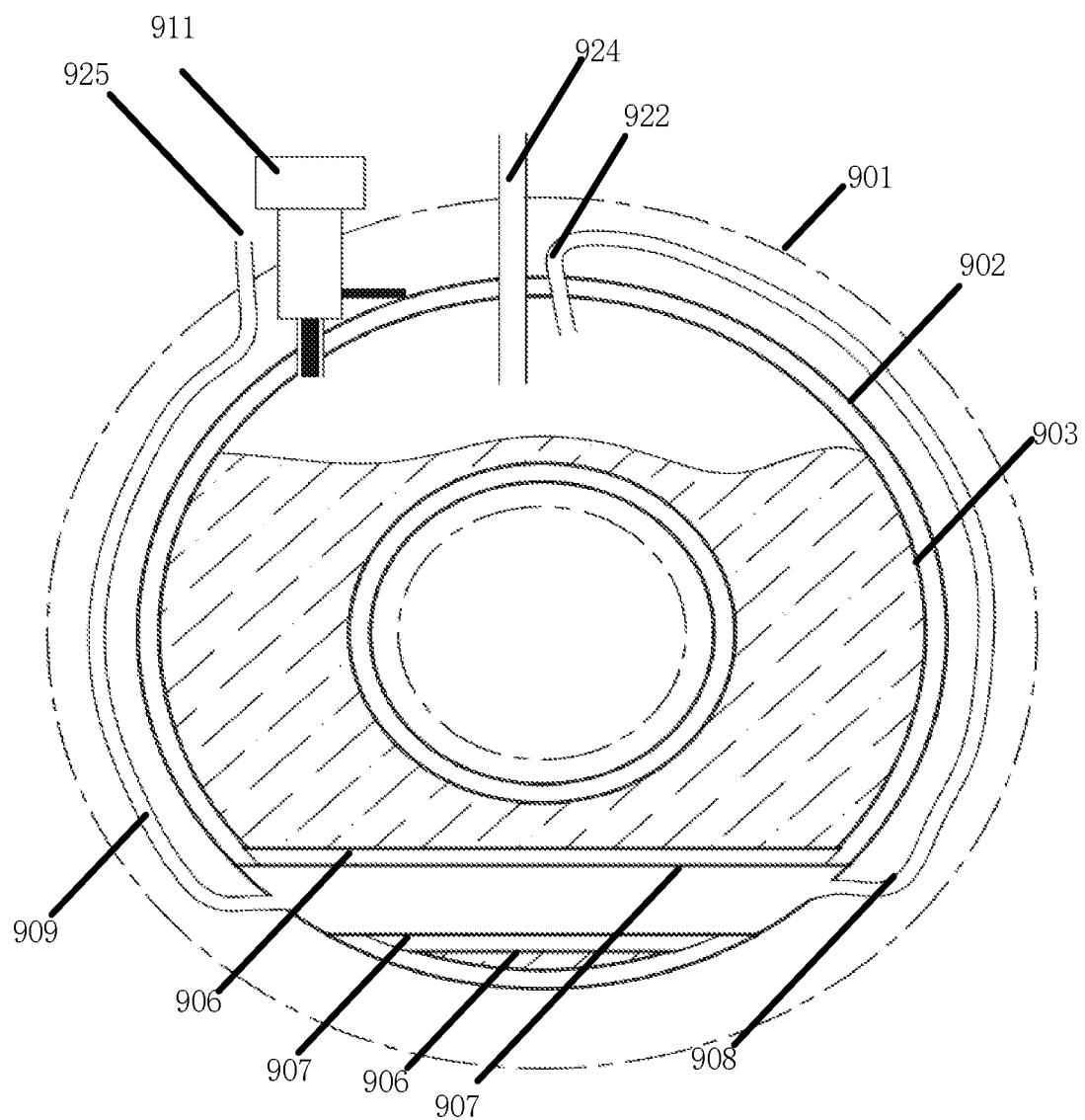
FIG. 9-B

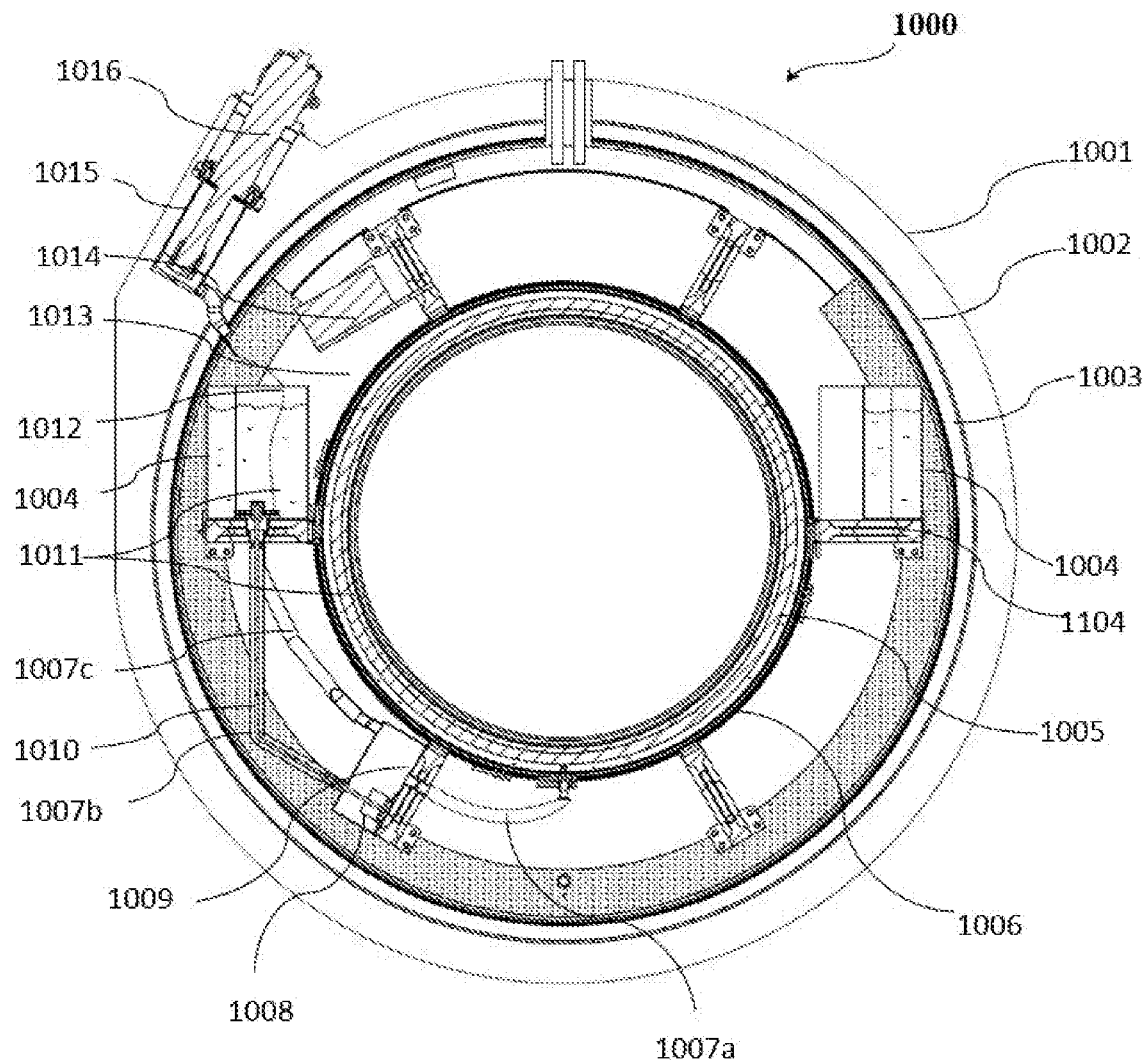
FIG. 10-A

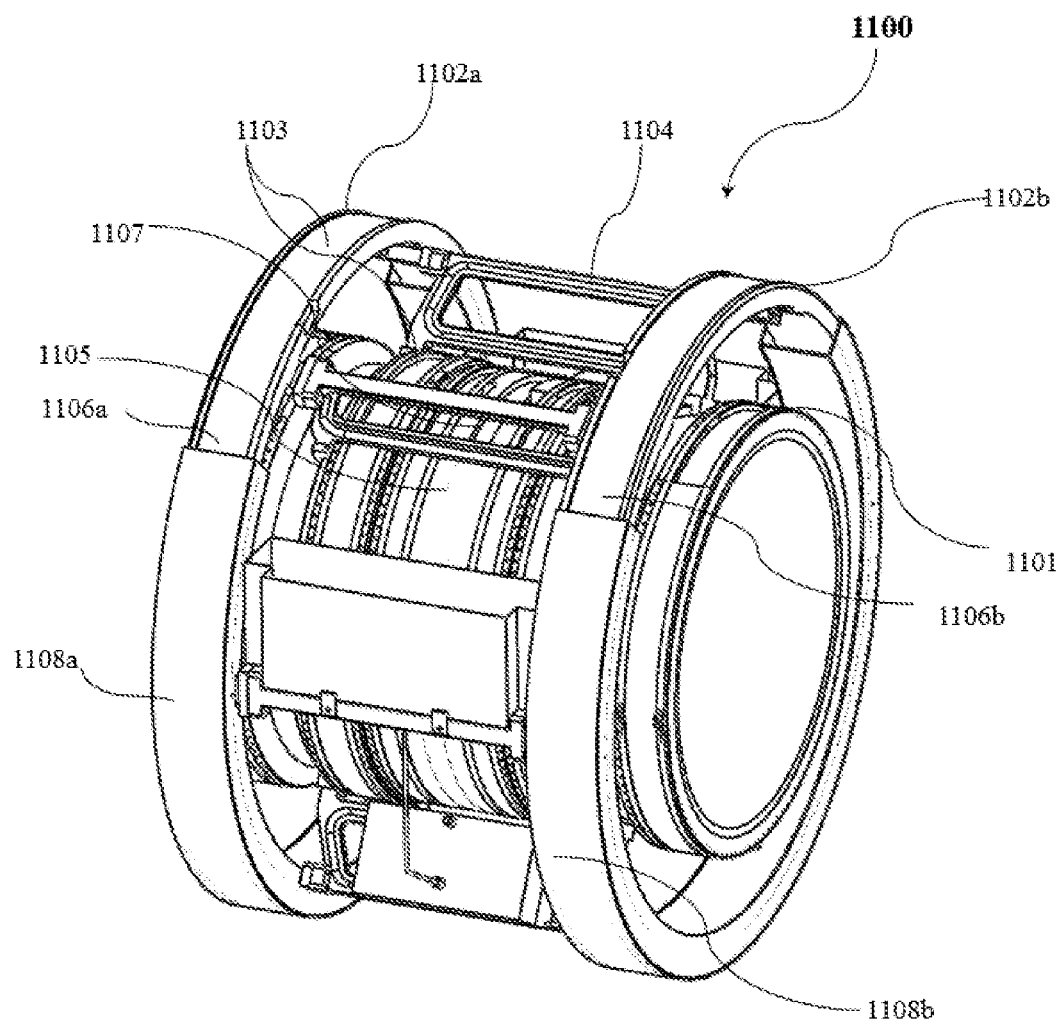
FIG. 10-B

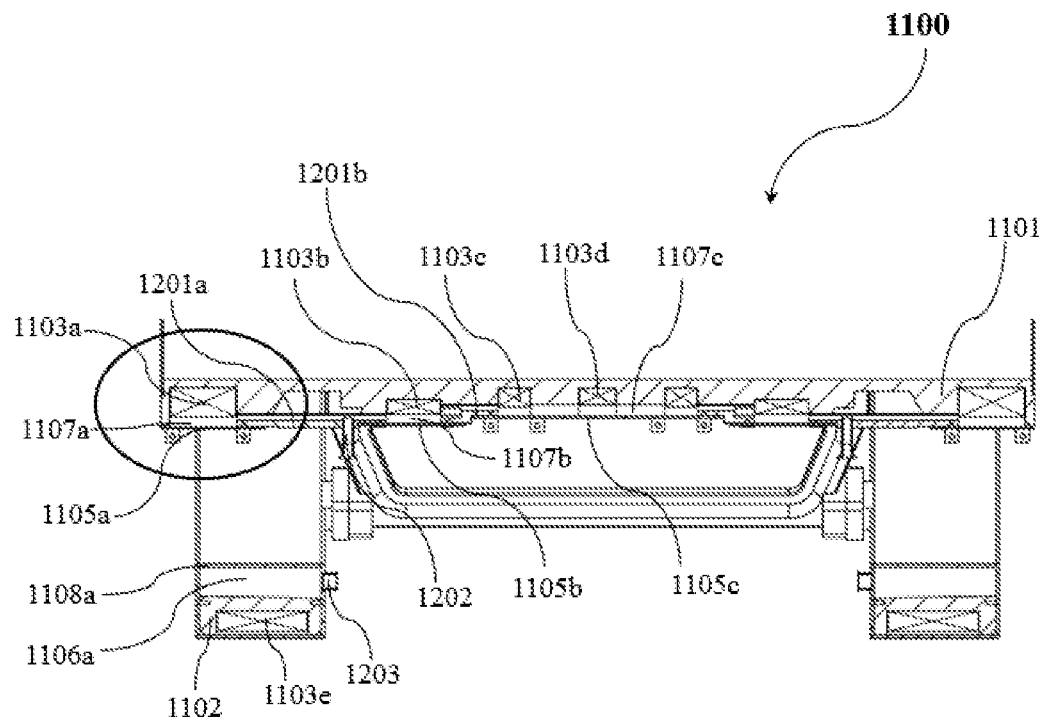
FIG. 10-C

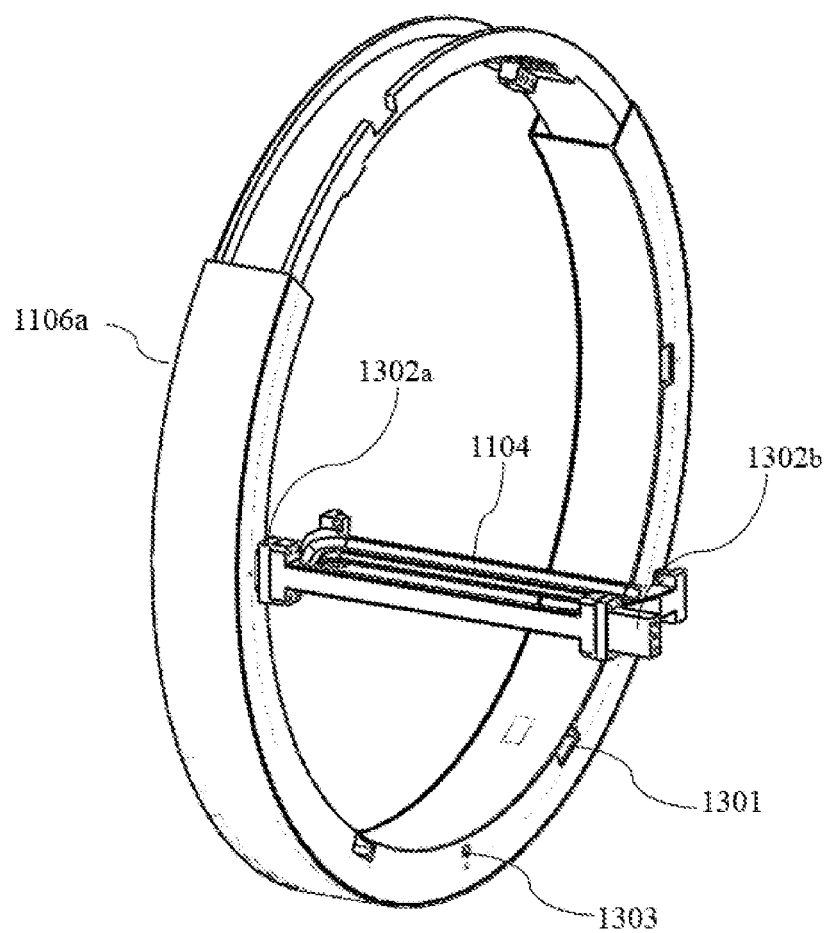
FIG. 10-D

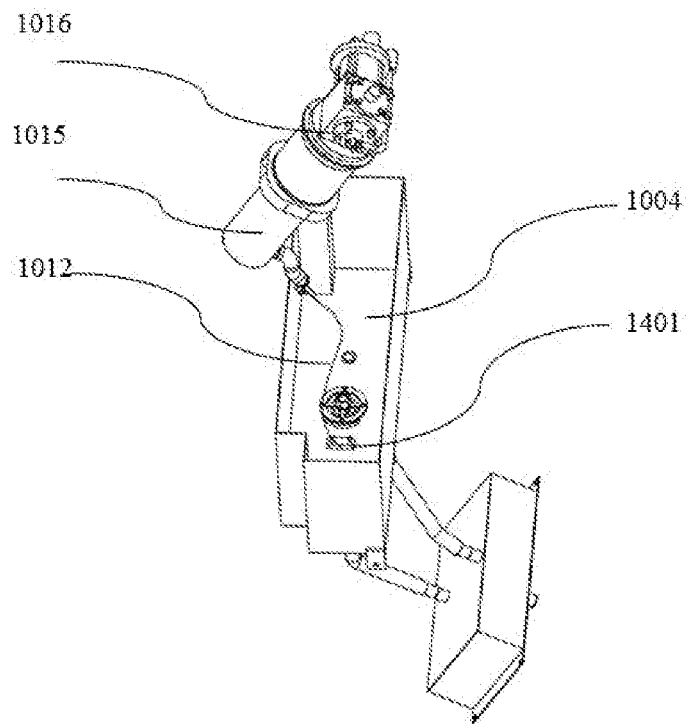
FIG. 10-E

DISPLACER IN MAGNETIC RESONANCE IMAGING SYSTEM

CROSS-REFERENCE TO RELATED APPLICATIONS

This application is a Continuation of U.S. application Ser. No. 15/310,441, filed on Nov. 10, 2016, which is a U.S. national stage under 35 U.S.C. § 371 of International Application No. PCT/CN2015/091148, filed on Sep. 30, 2015, which claims priority to Chinese Patent Application Nos. 201410614194.4 filed on Nov. 4, 2014, 201510054244.2 filed on Feb. 3, 2015, 201520490896.6 filed on Jul. 9, 2015, and 201510587181.7 filed on Sep. 15, 2015, the entire contents of each of which are hereby incorporated by reference.

TECHNICAL FIELD

The present disclosure generally relates to a system or structure applicable in a magnetic resonance imaging system. More particularly, the present disclosure relates to a system and structure for reducing cryogen consumption in a superconducting magnet system.

BACKGROUND

Conventionally, in a magnetic resonance imaging (MRI) system superconducting magnets are used to generate one or more magnetic fields, e.g., a main magnetic field, a gradient magnetic field, or a shielding magnetic field. Because of the characteristics of the superconducting material, most superconducting magnets need to work at an extremely low temperature for providing a stable magnetic field. For example, the operation temperature of superconducting magnet made by NbTi is approximately 4.2K, and the operation temperature of superconducting magnet made by $MgB_2$ is approximately 20-30K. Usually a liquid cryogen, such as liquid nitrogen, liquid helium, liquid hydrogen and liquid neon, may be used to provide such a low temperature environment. Such a liquid cryogen may be continuously consumed during the transportation of an MRI system from a manufacturer to a hospital or during the operation of the MRI system, and thus the cryogen may need to be re-filled regularly or from time to time.

The volume of a liquid cryogen needed in an MRI system may at least partially depend on the size of system cavities housing the liquid cryogen. Since the liquid cryogen, e.g., liquid helium, may be expensive, there is a need for a more efficient and cost-efficient way to control or adjust the size of such system cavities and improve the cooling efficiency, in order to reduce the consumption of such an expensive cryogen.

SUMMARY

The present disclosure relates generally to a superconductive magnet system, and more specifically to a system or structure for reducing cryogen consumption used in the cooling of a superconductive magnet system.

According to one aspect of the present disclosure, some space in a storage cavity in a superconductive magnet system may be occupied by at least a displacer. In one example, a displacer may be placed in the storage cavity in the superconductive magnet system. In another example, a cryogen storage reservoir may be formed by a displacer and one or more other components or structures, e.g., one or more walls of the storage cavity.

According to one aspect of the present disclosure, a displacer may occupy some spaces in the storage cavity in a superconductive magnet system and prevent a cryogen from filling into the occupied spaces. In some embodiments, the displacer may be a cylinder. The cylindrical displacer may be hollow or filled with one or more kinds of substances. Alternatively, the displacer may be a torus.

According to one aspect of the present disclosure, a reservoir may be formed by a displacer placed in a storage cavity in a superconducting magnet system and a cryogen may be confined in the reservoir. In some embodiments, the displacer may be a sheet-rolled-cylinder. The sheet-rolled-cylinder may form one or more reservoirs that may confine the cryogen into a relatively small volume. In one example, the displacer alone may form a reservoir, and confine the cryogen into a relatively small space of the reservoir. For example, the displacer may have an enclosed cross-section. The reservoir may be formed by a single piece of sheet, or may be formed by several pieces of sheets welded or connected together. In another example, the reservoir may be formed by the displacer and one or more structures of the storage cavity. The one or more structures of the storage cavity may include a wall of the inner housing, an end wall, a main coil former, a bucking coil former, or the like, or a combination thereof. The reservoir formed by the displacer alone or by the displacer together with one or more structures of the storage cavity may be closed or open. The reservoir formed by the displacer alone or by the displacer together with one or more structures of the storage cavity may contain the main coils, the bucking coils, the main coil former, the bucking coil former, or the like, or a combination thereof.

According to one aspect of the present disclosure, the displacer may be solid or hollow. When the displacer is hollow, any tube or pipe may exist in the displacer. The shape of the displacer may be essentially cylindrical, essentially cubic, essentially torus or other shapes which may be used to occupy some spaces or limit the cryogen into some spaces. The displacer may be made from metal (e.g., stainless steel, aluminum, copper, or an alloy thereof, or a combination thereof), polymer (e.g., epoxy resin), or a combination of these materials, or any other materials which may keep stable under low temperature and/or high pressure.

According to one aspect of the present disclosure, the displacer may be hollow and include a displacer cavity. The displacer cavity may contain a cryogen. In one example, the cryogen contained in the displacer may be same as or different from the cryogen contained elsewhere in the storage cavity. The cryogen contained in the displacer may be used to cool the wall of the storage cavity.

According to one aspect of the present disclosure, the superconducting magnet system may include one or more displacers. An axis of the displacer may be parallel or perpendicular to the axial direction of the superconducting magnet system or device. The axes of a plurality of displacers may be parallel to each other. The axes of two displacers may be at an angle other than 0 or 180 degrees with each other. The axes of the two displacers may be at an angle of 90 degrees with each other.

According to one aspect of the present disclosure, the displacer may confine the cryogen into a relatively small volume by forming a cryogen storage reservoir, in which case a superconducting magnet (e.g., coils used for generating a main magnetic field) may be immersed in or cooled by the cryogen confined in the cryogen storage reservoir formed with the displacer. In some embodiments, the cryogen storage reservoir may be formed by the displacer alone, or by the displacer along with one or more other structures in the system. Exemplary structures that may form a cryogen storage reservoir may include the inner housing, the outer housing, end walls, coil frameworks, coil formers, or the like, or a combination thereof. In some embodiments, the displacer may be hollow. In one example, the superconducting magnet may be deployed in the space outside the displacer, which may be isolated from the hollow space. In another example, the superconducting magnet may be deployed in the hollow space and cooled by the cryogen stored therein. In some embodiments, the displacer may contain at least a kind of filler in the hollow space, e.g., the same cryogen as stored in the storage cavity, or other substances that may have a higher or lower thermal mass than the cryogen stored in the storage cavity.

According to one aspect of the present disclosure, a superconducting magnet device may include a first superconducting coil mounted on a first coil former that may be at least partially enclosed by a first housing, and a second superconducting coil mounted on a second coil former. The device may further comprise a first storage cavity at least partially defined by the first housing, the first coil former, and the second coil former, wherein the storage cavity is configured to contain a volume of a first cryogen in the liquid state. The device may further comprise a displacer defining a first volume within the first storage cavity. In some embodiments, the displacer and the first superconducting coil may be at least partially immersed in the first cryogen in the liquid state. In some embodiments, the displacer and the first superconducting coil may be at least partially immersed in the first cryogen in the gaseous state. In some embodiments, the displacer may be hollow. In some embodiments, the displacer may be at least partially filled with a second cryogen. In some embodiments, the device further comprise a thermal shielding housing, wherein the thermal shielding housing may be outside of the first housing. In some embodiments, a first part of the thermal shielding housing may be disposed through the displacer. A tube may connect the first part of the thermal shielding housing to the storage cavity, wherein the tube may exchange heat with the thermal shielding housing. In some embodiments, the first part of the thermal shielding housing may contain a third cryogen. In some embodiments, the third cryogen may be the same as the first cryogen. In some embodiments, the third cryogen may be different from the first cryogen. In some embodiments, the third cryogen may be the first cryogen in a different state of matter. Under certain conditions (e.g., powered off during transportation of the superconducting magnet device), the third cryogen may transfer heat with the thermal shielding housing, while decelerating the temperature increasing rate of the first housing.

According to one aspect of the present disclosure, a superconducting magnet device may comprise a storage cavity, a first coil former configured to support a first superconducting coil, a first displacer disposed within the storage cavity, and a first storage reservoir at least partially defined by the first displacer and the first coil former. The first reservoir may contain a first cryogen in the liquid state. At least part of the first superconducting coil contained in the first storage reservoir may be immersed in the first cryogen in the liquid state. In some embodiments, the superconducting magnet further comprising a second coil former to support a second superconducting coil. The superconducting magnet may further comprise a second, and a second storage reservoir at least partially defined by the second coil former and the second displacer. At least part of the second coil contained in the second storage reservoir may be immerged in a second cryogen. The volume of the second storage reservoir may be at least defined by the second displacer, the second coil former and the second superconducting coil. In some embodiments, the second storage reservoir may be isolated from the first storage reservoir. In some embodiments, the second storage reservoir may be in fluid communication with the first storage reservoir. The first cryogen may be the same as the second cryogen. The materials of the first displacer and the second displacer may be the same, or may be different. The first displacer and/or the second displacer may be made from stainless steel, copper, aluminum, or an alloy thereof. In some embodiments, the first displacer and/or the second displacer may be in the form of a torus or a portion thereof. The first displacer may have an opening angle varying from 0 degree to 180 degrees. The second displacer may have the same opening angle as the first displacer. Alternatively, the second displacer may have an opening angle different from the first displacer. In some embodiments, the superconducting magnet device may further comprise a buffering tank that may be in fluid communication with the first storage reservoir and/or the second storage reservoir.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIGS. 4-A and FIG. 4-B depict exemplary superconducting magnet structures in accordance with some embodiments of the present disclosure;

FIG. 4-C shows exemplary liquid cryogen regions in a superconducting magnet structure in accordance with some embodiments of the present disclosure;

FIGS. 5-A to FIG. 5-C show exemplary displacers with different shapes according to some embodiments of the present disclosure;

FIGS. 6-A and 6-B show exemplary displacer layouts according to some embodiments of the present disclosure;

FIG. 7-A illustrates an exemplary cylinder displacer according to some embodiments of the present disclosure;

FIG. 7-B illustrates an exemplary cryogen storage reservoir in accordance with some embodiments of the present disclosure;

FIG. 8-A shows an exemplary configuration of a displacer according to some embodiments of the present disclosure;

FIG. 8-B shows an exemplary configuration of a superconducting magnet structure according to some embodiments of the present disclosure;

FIG. 8-C shows an exemplary layout of a tube according to some embodiments of the present disclosure;

FIG. 8-D shows an exemplary displacer structure according to some embodiments of the present disclosure;

FIG. 8-E shows an exemplary structure of a hoop according to some embodiments of the present disclosure;

FIG. 9-A is a longitudinal view of an exemplary cryostat according to some embodiments of the present disclosure;

FIG. 9-B is a cross-sectional view of an exemplary cryostat according to some embodiments of the present disclosure;

FIG. 10-A illustrates an exemplary superconducting magnet system according to some embodiments of the present disclosure;

FIG. 10-B is a perspective view of an exemplary superconducting magnet structure according to some embodiments of the present disclosure;

FIG. 10-C illustrates a cross-sectional view of an exemplary superconducting magnet structure according to some embodiments of the present disclosure;

FIG. 10-D illustrates a perspective view of an exemplary reservoir according to some embodiments of the present disclosure; and FIG. 10-E illustrates an exemplary chamber according to some embodiments of the present disclosure.

DETAILED DESCRIPTION

Figure 1:
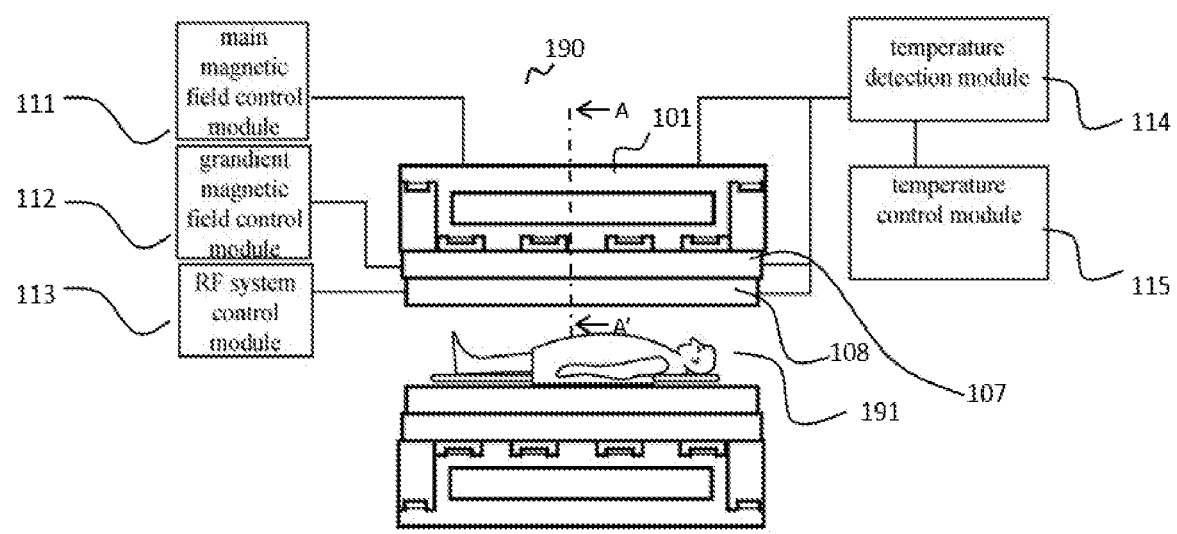
FIG. 1 is a schematic diagram of an exemplary magnetic resonance imaging (MRI) system in accordance with some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure.

It will be understood that the term "system," "unit," "module," and/or "block" used herein are one method to distinguish different components, elements, parts, section or assembly of different level in ascending order. However, the terms may be displaced by other expression if they may achieve the same purpose.

It will be understood that when a unit, module or block is referred to as being "on," "connected to" or "coupled to" another unit, module, or block, it may be directly on, connected or coupled to the other unit, module, or block, or intervening unit, module, or block may be present, unless the context clearly indicates otherwise. As used herein, the term "and/or" includes any and all combinations of one or more of the associated listed items.

The terminology used herein is for the purpose of describing particular example embodiments only and is not intended to be limiting. As used herein, the singular forms "a," "an" and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

These and other features, and characteristics of the present disclosure, as well as the methods of operation and functions of the related elements of structure and the combination of parts and economies of manufacture, may become more apparent upon consideration of the following description with reference to the accompanying drawing(s), all of which form a part of this specification. It is to be expressly understood, however, that the drawing(s) are for the purpose of illustration and description only and are not intended to limit the scope of the present disclosure. It is understood that the drawings are not to scale.

FIG. 1 is a schematic diagram of an exemplary magnetic resonance imaging (MRI) system. The magnetic field device 190 may include a main magnetic field device 101, a gradient magnetic field device 107, and a radiofrequency (RF) coil system 108. The main magnetic field device 101 may generate a static homogenous magnetic field. More descriptions regarding the main magnetic field device 101, as well as a temperature detection module 114 and a temperature control module 115, are provided elsewhere in the present disclosure. A gradient magnetic field device 107 may be configured or used to provide a magnetic gradient field, e.g., a magnetic field with varying strengths along one direction. The gradient magnetic field device 107 may connect to a gradient magnetic field control module 112. The gradient magnetic field control module 112 may include a gradient amplifier. The gradient amplifier may be configured or used for amplifying a signal before it reaches the gradient coils in the gradient magnetic field device 107. In this way, the strength of the field provided by gradient coils is sufficient to produce the variations in the main magnetic field for localization of the later received signal. The RF coil system 108 may be configured or used to transmit the machine-generated RF radiation to a target (e.g., the body of a patient or a portion thereof to be imaged) and/or receiving the nuclear magnetic resonance (NMR) signal(s) from the target during an imaging procedure. A coil contained in the RF coil system 108 may be configured or used for both transmitting RF radiation and receiving NMR signal(s), or transmitting RF radiation only, or receiving NRM signal(s) only. The RF coil system 108 may connect to a RF system control module 113. The RF system control module 113 may include a transmitting/receiving (T/R) switch. The T/R switch may be configured or used for enabling and disenabling the receiving and/or the transmission function of the RF coils in the RF coil system 108. The RF system control module 113 may further include one or more components for achieving other functions, such as coding, decoding, modulating, demodulating, signal amplifying, and so on. A patient or a subject to be imaged may be positioned within a patient imaging volume 191 of the magnetic field device 190. The patient imaging volume 191 may be cylindrical. The position of the patient or the subject may be controlled by a patient position control module (not shown in FIG. 1).

Figure 2:
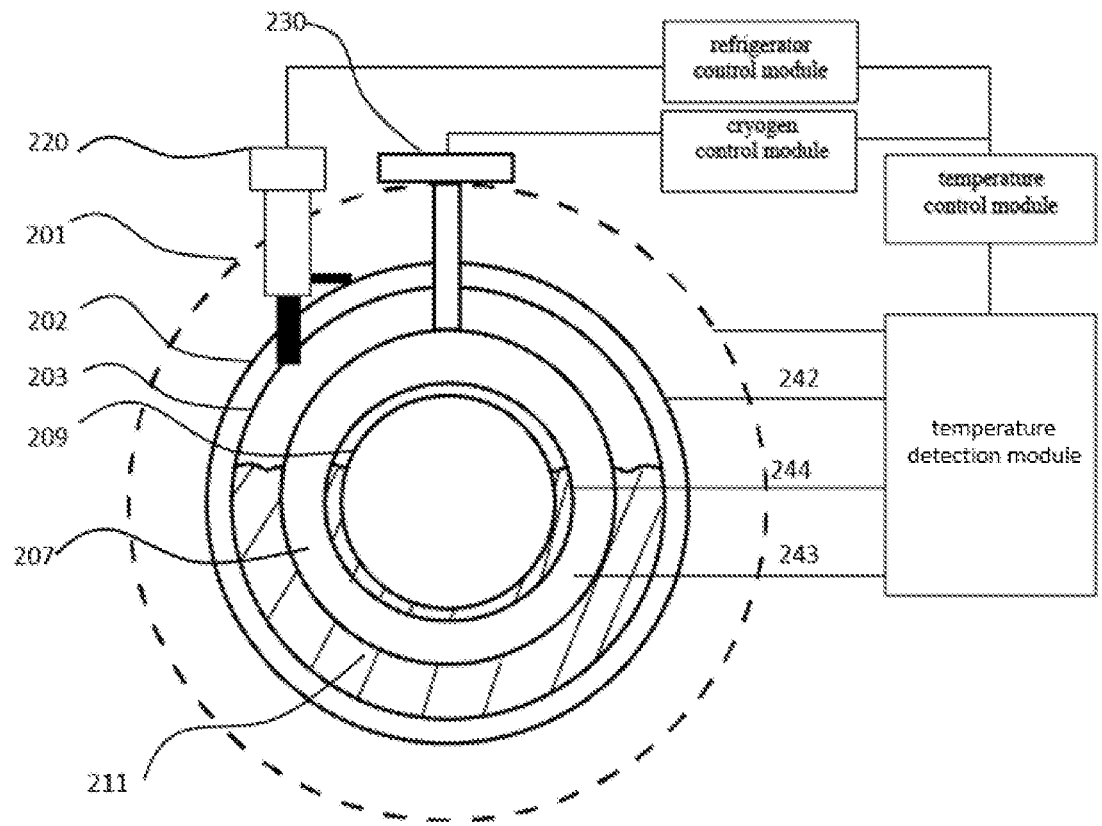
FIG. 2 is a cross-sectional view of an exemplary superconducting magnet in accordance with some embodiments of the present disclosure.

FIG. 2 is a cross-sectional view along lines A-A' of FIG. 1. The main magnetic field device 101 may include a first housing 201 and an inner housing 209. A thermal shielding housing (also referred to as the shielding housing) 202 may be located between the first housing 201 and the inner housing 209. The thermal shielding housing 202 may be configured or used for shielding heat transfer across the first housing 201. Between the inner housing 209 and the thermal shielding housing 202, an outer housing 203 may exist. The space between the first housing 201 and the outer housing 203 may be vacuum for thermal insulation purposes. All the housings and layers mentioned hereinabove, may be realized, for example, as an annular cylinder with a hollow tubular that is blocked off at its ends to form an internal cryogen storage volume.

A storage cavity 211, the space between the outer housing 203 and the inner housing 209, may contain a superconductive magnet that may be used for generating a main magnetic field. Since the operation temperature of the superconductive is extremely low, the storage cavity may contain cryogen, such as but not limited to, liquid helium, liquid nitrogen, liquid hydrogen, or the like, or a combination thereof. For the liquid cryogen, the cryogen fill level may be higher or lower than the position of center of the axis of the inner housing 209.

A cryocooler 220 may be used to cool the housings and layers mentioned herein and also a vaporized cryogen. The cryocooler 220 may have two stages. The two stages may be at two different temperatures. Merely by way of example, one stage with the temperature of approximately 4.5K may be used for cooling the outer housing 203 and/or the vaporized cryogen from the storage cavity 211, while the other stage with the temperature of approximately 40K to 70K may be used for cooling the thermal shielding housing 202. The temperature of the two stages may be configured based on the working condition of the superconducting magnet system. Examples of such conditions may include the kind of cryogen used in the superconducting magnet system or a portion thereof, the volume of the cryogen used in the superconducting magnet system or a portion thereof, the desired working temperature of the superconducting magnet, a tolerable temperature changing rate of the superconducting magnet system, the thermal conduction between different housings mentioned above, the cooling efficiency of the superconducting magnet system, or the like, or a combination thereof.

The volume of the cryogen in the storage cavity 211 may be adjusted. For example, a displacer 207 may be placed in the storage cavity 211. In some embodiments, the displacer 207 may occupy some volume of the storage cavity 211 and reduce the volume of the cryogen needed to fill the storage cavity 211 to a certain level. In some embodiments, the displacer 207 may confine the cryogen into a relatively small volume by forming a cryogen storage reservoir. A superconducting magnet (e.g., coils used for generating a main magnetic field) may be immersed or cooled by the cryogen confined in the cryogen storage reservoir formed with the displacer 207. The cryogen storage reservoir may be formed by the displacer 207 alone, or by the displacer 207 along with one or more other structures in the system (not shown in FIG. 2, but described elsewhere in the present disclosure). Exemplary structures that may form a cryogen storage reservoir may include the inner housing, the outer housing, an end wall, a coil framework, a coil former, or the like, or a combination thereof. In some embodiments, the displacer may be hollow. In one example, the superconducting magnet may be located in the space outside the displacer, which may be separate or isolated from the hollow space within the displacer. In some embodiments, the displacer may contain at least a kind of filler in the hollow space, e.g., the same cryogen as stored elsewhere in the storage cavity 211 or other substances that may have a higher or lower thermal mass than the cryogen stored elsewhere in the storage cavity 211. More descriptions regarding the displacer 207, as well as various embodiments thereof, are provided elsewhere in the present disclosure.

It shall be noted that the displacer 207 may divide the storage cavity 211 into several sections. In some embodiments, these sections of the storage cavities may be isolated from each other. Merely by way of example, the cryogen in one section of the storage cavity 211 does not flow or move to another section of the storage cavity 211. In some embodiments, at least some sections of the storage cavity 211 may be in fluid connection with each other. Merely by way of example, the cryogen in one section of the storage cavity 211 may flow or move to another section of the storage cavity 211. In some embodiments, at least some sections of the storage cavity 211 may be in thermal contact with each other. Merely by way of example, one section of the storage cavity 211 may exchange heat with another section of the storage cavity 211.

A tube may be placed to connect the interior cavity of the displacer to the storage cavity, or the outside, such as the thermal shielding housing 202, the outer housing, or the like. The tube may connect (e.g., in fluid communication with) a pump, a cryogen storage device, or a cryorefrigerator that may include a recondenser. As used herein, a pump, a cryogen storage device, or a cryorefrigerator that may include a recondenser may be configured to produce or store the cryogen that may be used in the storage cavity. In some embodiments, the tube is not in close contact with the thermal shielding housing 202 or the outer housing 203 (see, for example, FIG. 8-B), the cryogen may flow into/out of the displacer 207 or the storage cavity 211 from a pump or a cryogen storage device. In some embodiments, the tube may be deployed on or in a thermal contact with the thermal shielding housing 202 or the outer housing 203. Thus, when a cryogen flows into/out of the displacer 207 or the storage cavity 211 through the tube, heat transfer may occur between the tube and the thermal shielding housing 202 or the outer housing 203, which may cool the thermal shielding housing 202 or the outer housing 203. The tube may be made of a thermally conductive material, such as copper, aluminum, stainless steel, or the like, or an alloy thereof, or a combination thereof. The contacting area between the tube and the thermal shielding housing 202 or the outer housing 203 may be at least 0.5%, or at least 1%, or at least 3%, or at least 10%, or at least 30%, or at least 40%, or at least 50%, or at least 60%, or at least 80% of the total area of the thermal shielding housing 202 or the outer housing 203. It should be noted that the descriptions regarding the tube are for illustration purposes and not intended to limit the scope of the present disclosure. Those having ordinary skills in the art may make adjustments of the materials, number, length, or layout of tube based on different working conditions.

Temperature may be detected and/or controlled at different locations in the superconducting magnet system. For example, a temperature detecting probe 244 may be used for detecting temperature of the area close to the inner housing 209. A temperature detecting probe 243 may be used for detecting the temperature of the area close to the outer housing 203. A temperature detecting probe 242 may be used for detecting the temperature of the area close to the thermal shielding housing 202. One or more of these probes may be connected to or communicate with the temperature detection module 114. If the temperature of a specific area exceeds a predetermined range, a signal may be generated and forwarded to the temperature control module 115. The temperature control module 115 may send a command signal to a cryocooler control module to activate or adjust the operation of the cryocooler 220 and/or command the cryogen control module to adjust the volume of the cryogen in the storage cavity 211 and/or of the displacer 207.

Figure 3:
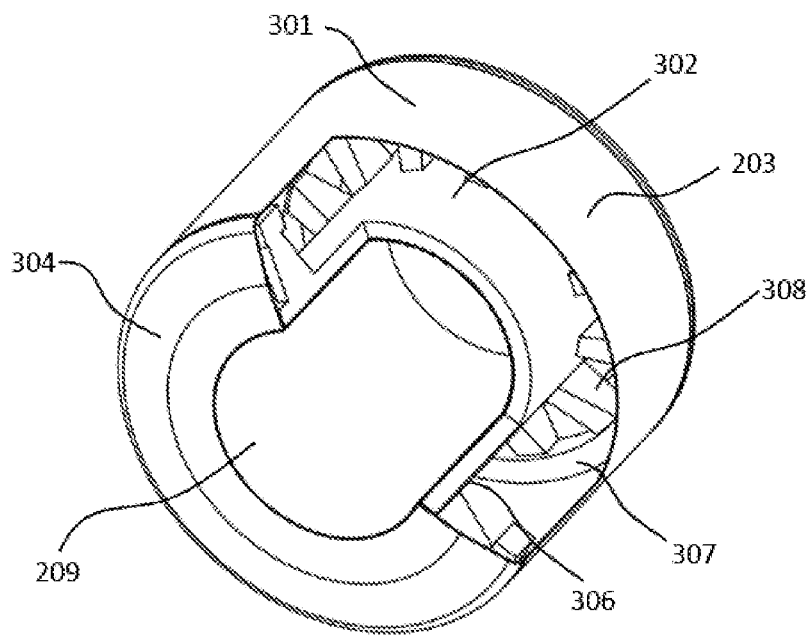
FIG. 3 is a schematic perspective view of a superconducting magnet in accordance with some embodiments of the present disclosure.

FIG. 3 is a schematic perspective view of a superconducting magnet in accordance with some embodiments of the present disclosure. As illustrated, the superconducting magnet may have an essentially cylindrical shape. It should be appreciated by those skilled in the art that the superconducting magnet is not limited to such a shape; configurations according to other embodiments may include, e.g., essentially cuboid, essentially ellipsoid, essentially sphere, or the like, or a combination thereof. The superconducting magnet may include a storage cavity 301 for storing a cryogen, and superconducting coils 302 coaxially mounted inside the storage cavity 301.

An exemplary storage cavity 301 may be formed by an extrusion of an appropriate material, such as copper, aluminum, stainless steel, or a composite thereof, or the like, or a combination thereof. Alternatively, the storage cavity 301 may be formed from rolled or welded parts including, e.g., an inner housing 209, an outer housing 203, a housing cover 304 connecting the outer housing 203 and the inner housing 209 to block one end of the storage cavity 301, or the like, or a combination thereof. The rolled or welded parts may be formed of a thermally conductive material including, e.g., copper, aluminum, stainless steel, or the like, or an alloy thereof, or a combination thereof. In an example, the rolled or welded parts may be formed from a same kind of thermally conductive material. In another example, the rolled or welded parts may be formed from at least two different kinds of thermally conductive materials. In still another example, the rolled or welded parts may be formed from at least one kind of thermally conductive material and at least one kind of thermally insulating material.

The storage cavity 301 may store at least one kind of cryogen. The storage cavity 301 may store two or more different kinds of cryogens. The storage cavity 301 may store a same cryogen of a same or different states. For example, the storage cavity 301 may store a liquid cryogen (e.g., liquid nitrogen, liquid nitrogen, or the like, or a combination thereof), a solid cryogen (e.g., solid nitrogen, or the like), a gaseous cryogen (e.g., a gaseous cryogen boiled-off from a liquid cryogen), or the like, or a combination thereof.

The superconducting coils 302 may include main coils 306 and bucking coils 307. The main coils 306 and/or the bucking coils 307 may be arranged coaxially about the central axis of the superconducting magnet. The main coils 306 and/or the bucking coils 307 may be wound on or about coil frameworks. See, e.g., relevant description regarding FIGS. 4-A and 4-B of the present disclosure. A coil framework may be provided to retain the main coils 306 and/or the bucking coils 307 in their respective positions. Merely by way of example, the main coils 306 may be mounted near the inner housing 209, the bucking coils 307 may be mounted on a former near the outer housing 203. In some embodiments, a coil framework may include one or more coil slots. The main coils 306 may be mounted in one or more coil slots on a coil framework. The bucking coils 307 may be mounted in one or more coil slots on a coil framework. The coil slots may be evenly spaced or unevenly spaced from each other. In some embodiments, the coil slots may be symmetrically arranged on a coil framework. The main coils 306 may serve to generate the main magnetic field of the MRI system when the main coils 306 are energized with a current. The bucking coils 307 may generate a shielding magnetic field when energized with a current in a direction opposite to the current in the main coils 306. The shielding magnetic field may reduce or minimize the effects of the main magnetic field on other electronics. The distance between the bucking coil center and each of the bucking coils may be greater than that between the main coil center and each of the main coils. In some embodiments, the bucking coil center may coincide with the main coil center. In some embodiments, the bucking coil center or the main coil center may coincide with the axis of the outer housing 203 or the axis of the inner housing 209.

Since the operation temperature of the superconductive magnet may be extremely low, the main coils 306 and/or the bucking coils 307 may need to be cooled by the cryogen contained in the storage cavity 301. In some embodiments, at least some of the main coils 306 and/or at least some of the bucking coils 307 may be completely immersed in a first cryogen (e.g., liquid helium, liquid nitrogen, etc.). In some embodiments, the main coils may be completely immersed in a first cryogen, while the bucking coils may be partially immersed in the first cryogen and partially contained in a second cryogen that is different from the first cryogen. In some embodiments, both the main coils and the bucking coils may be partially immersed in a first cryogen and partially contained in a second cryogen.

As used herein, the first cryogen and the second cryogen may be different substances in a same state. Merely by way of example, the first cryogen may be one substance in the liquid state, and the second cryogen may be another substance in the liquid state. In some embodiments, the first cryogen and the second cryogen may be a same substance in different states. Merely by way of example, the first cryogen may be one substance in the liquid state, and the second cryogen may be the same substance in the gaseous state. Merely by way of example, the first cryogen may be a first substance in a first state, and the second cryogen may be a second substance in a second state, where the first substance and the second substance are different and where the first state and the second state are different. For instance, the first cryogen may be a liquid cryogen, e.g., liquid helium, and the second cryogen may be a gaseous cryogen boiled-off from the liquid cryogen, e.g., gaseous helium.

In some embodiments, the quantity of a liquid cryogen stored within the storage cavity 301 may be sufficient to keep the respective coils immersed therein at their operating temperature. The quantity may be determined by, for example, the number or amount of immersed part of the main coils 306 or the bucking coils 307, the cooling capacity needed under the operating condition, during transportation, during power-off, or when quenching occurs, the volume of the storage cavity 301, a desired cryogen fill level, or the like, or a combination thereof. A structure or article laid inside the storage cavity 301 may also change the quantity of a liquid cryogen in the storage cavity 301. Examples of such structures or articles may include a displacer including, e.g., a block, a shield, or the like, or a combination thereof.

FIGS. 4-A and FIG. 4-B show exemplary superconducting magnet structures in accordance with some embodiments of the present disclosure. The superconducting magnet structure may include a container 10, a superconducting coil unit 20, and a displacer 30. The container 10 may include an inner housing 11, an outer housing 12 arranged at a certain distance from the inner housing 11, a storage cavity 13 formed between the inner housing 11 and outer housing 12, a bore 14 where a target (e.g., one to be imaged in the MRI system) may be positioned. The storage cavity 13 may contain a certain amount of a liquid cryogen (not shown in FIG. 4-A or FIG. 4-B). In some embodiments, the liquid cryogen may be liquid helium. In some embodiments, different kinds of a liquid cryogen may be used according to considerations including, e.g., the material of the superconducting coils. For example, coils made from superconducting materials, such as NbTi, $Nb_3Sn$, may work under a temperature approximately 4.2K, the cooling of which may be provided by liquid helium (LHe). In another example, coils made from a superconducting material including, e.g., $MgB_2$, may work under a temperature approximately 20K, the cooling of which may be provided by liquid hydrogen ($LH_2$). In a further example, coils made from a high-temperature superconducting material, e.g., BSCCO, YBCO, may work under a temperature below 80K, the cooling of which may be provided by liquid nitrogen ($LN_2$) or liquid neon (LNe). These examples are intended to be illustrative; many alternatives, modifications, and variations will be apparent to those skilled in the art.

The superconducting coils unit 20 may be housed in the storage cavity 13. The superconducting magnetic coil unit 20 may include a coil framework 21 situated on the inner housing 11, and superconducting coils 22 mounted on the coil framework 21. At least some or part of the superconducting coils 22 and the coil framework 21 may be immersed in the liquid cryogen below the fill level H. As used herein, the fill level H may indicate the volume of cryogen stored in the container 10, e.g., the space below the fill level H in the container may be filled with a liquid cryogen, while the volume above the fill level H in the container may contain no liquid cryogen. In some embodiments, the coil framework 21 may be situated on the outer housing 12. Alternatively, the coil framework 21 may be situated partly on the inner housing 11 and partly on the outer housing 12. The superconducting coils 22 are kept in the superconducting state when cooled by the cryogen contained in the storage cavity 13, approximately 4.2K in the case of liquid helium.

At least a portion of the displacer 30 may be immersed below the liquid cryogen fill level H. The immersed part of the displacer 30 may be in thermal contact with the liquid cryogen. The liquid cryogen may fill the space below the cryogen fill level H except for the space occupied by the superconducting coil unit 20 and the portion of the displacer 30 below H. By employing a displacer 30, the volume of cryogen need to fill the space housing the cryogen may be reduced.

The volume of the portion of the displacer 30 below the fill level H may be configured according to one or more considerations. In some embodiments, the cryogen fill level H may be at least 50% of the height of the superconducting magnet structure. In some embodiments, the cryogen fill level H may be at least 60% of the height of the superconducting magnet structure. In some embodiments, the cryogen fill level H may be at least 70% of the height of the superconducting magnet structure. In some embodiments, the cryogen fill level H may be at least 80% of the height of the superconducting magnet structure. As used herein, the height of the superconducting magnet structure is the outer diameter of the outer housing 12. The volume of the portion of the displacer 30 below H may be at least 30%, or at least 40%, or least 50%, or at least 55%, or at least 70%, or at least 90% of the volume of the entire displacer 30. It shall be appreciated by those having ordinary skills in the art that the displacer 30 may take one of various forms or structures. For example, the displacer 30 may be in the form of a sheet, a tube, a block, an enclosed structure, a closed loop structure, an open loop structure, or the like, or a combination thereof, which will be discussed later.

In some embodiments, the coil framework 21 may include a main coil former 410 and a bucking coil former 411 along the axial direction of the superconducting magnet system or device. As used herein, the axial direction of the superconducting magnet system or device may indicate the direction a patient or a subject being sent into the patient imaging volume 191. The main coil former 410 may have, for example, a toroidal shape or a cylindrical shape. In some embodiments, the coil framework 21 may include two bucking coil formers 411. The main coil former 410 may be located between the two bucking coil formers 411. One or more bucking coil formers 411 may have a toroidal shape or a cylindrical shape. A first distance between a bucking coil former 411 and the outer housing 12 may be shorter than a second distance between the main coil former 410 and the outer housing 12, thereby forming a groove 23 on one side of the coil framework 21 facing the outer housing 12. The difference between the first distance and the second distance may be provided by that the outer diameter of a bucking coil former 411 is larger than the outer diameter of the main coil former 410. There may be one or more coil slots on the main coil former 410 positioned at the bottom of the groove 23. There may be one or more coil slots on a bucking coil former 411.

The superconducting coils 22 may include one or more main coils 420. The main coils 420 may be wound on the coil slots of the main coil former 410. The superconducting coils 22 may include one or more bucking coils 421. The bucking coils 421 may be wound on the coil slots of the bucking coil former 411. The main coils 420 may be situated between two bucking coil former 411, located at the bottom of the groove 23. The main coils 420 may serve to generate the main magnetic field of the MRI system when energized with a current. The bucking coils 421 may generate a shielding magnetic field when energized with a current, in a direction that is opposite to the current in the main coils. The shielding magnetic field may reduce or minimize the effects of main magnetic field on other electronics.

In some embodiments, coils, including the main coils 420 and bucking coils 421, may be cooled by different cryogens including a first cryogen and a second cryogen. In some embodiments, the coils may be cooled by a same cryogen of different states. For example, the main coils 420 may be completely immersed in and cooled by a liquid cryogen; the bucking coils 421 may be partially immersed in and cooled by a same liquid cryogen (i.e., the portions below the cryogen fill level H) and partially cooled by a gaseous cryogen, e.g., the same cryogen boiled off from the liquid state in which part of the bucking coils are immersed. In a further example, the cooling effect by a same cryogen locating at various regions of the superconducting magnet system may be different. Cooling may be achieved largely in a first region of a liquid cryogen that is close to the surface of the coils 22 and/or the coil frameworks 21. The volume of the first region may constitute a relatively small portion of the total volume of all the liquid cryogen in the superconducting magnet system. In some embodiments, the volume of the first region may be no more than 35%, or no more than 25%, or no more than 20%, or no more than 10%, or no more than 5% of the total volume of all the liquid cryogen in the superconducting magnet system.

FIG. 4-C shows exemplary liquid cryogen regions in a superconducting magnet structure in accordance with some embodiments of the present disclosure. The groove 23 may be divided into a first groove region 431 and a second groove region 432. The first groove region 431 may be closer to the surface of coils 22 and the coil frameworks 21 compared to the second groove region 432. The volume of the first groove region 431 may be smaller than the second groove region 432. The liquid cryogen in the first groove region 431 may contribute more to the cooling of the coils 22 and the coil frameworks 21 than the liquid cryogen in the second groove region 432 may (if any). One or more displacers may be located in a storage cavity, e.g., in the second groove 432. Such displacers may be of various shapes, sizes, or structures. Such displacers may be mounted in a storage cavity in a manner to accommodate the storage cavity.

In some embodiments, a displacer may be made from any suitable material including, e.g., a non-porous material.

Exemplary materials may include stainless steel, aluminum alloy, epoxy resin, or the like, or an alloy thereof, or a combination thereof. The displacer may be either hollow or filled with a filler. In some embodiments, the filler may be in thermal contact with the displacer. In some embodiments, the filler may exchange heat with the cryogen outside the displacer by, e.g., conduction across the surface of the displacer. The material of the displacer may have a strength or rigidity sufficient to withstand the pressure difference between the inside and the outside of the displacer.

In some embodiments, an inner cavity of a displacer may be filled with a gas, e.g., helium gas. Assume that the pressure of the gas in the inner cavity of the displacer is P before the gas is cooled by a liquid cryogen. When the liquid cryogen cools the superconducting coils to approximately 4.2K, the displacer may be cooled simultaneously but the filler gas is not liquefied. The gas pressure in the inner cavity may still be approximately P. Under the superconducting condition, the gas pressure in the storage cavity outside the displacer may be $P_0$ (e.g., 1 atm). Then the gas pressure difference between the inside and the outside of the displacer may be $P-P_0$. During quenching, the gas pressure in the storage cavity outside the displacer may increase to, e.g., $2P_0$. Then the gas pressure difference between the inside and the outside of the displacer may be $P-2P_0$.

In some embodiments, the absolute value of the gas pressure difference under the superconducting condition and the quenching condition may be equal, which means $|P-P_0|=|P-2P_0|$. For example, the gas pressure P in the inner cavity of the displacer may be approximately 1.5 atm. Thus, the absolute value of gas pressure difference between the inside and the outside of the displacer under both the superconducting condition and the quenching condition may be 0.5 atm.

In some embodiments, the gas filling the inner cavity of the displacer may be a gas other than the cryogen that may cool the superconducting coils in the gaseous state, e.g., air. The displacer may be cooled and the filler gas may be liquefied when the liquid cryogen cools the superconducting coils to approximately 4.2K, which may result in zero gas pressure in the inner cavity of the displacer. Thus, the gas pressure difference between the inside and the outside of the displacer under superconducting conditions may be 1 atm, while the gas pressure difference during quenching may be 2 atm.

In some embodiments, the inner cavity of a displacer may be a vacuum chamber. Thus, under the superconducting condition, the pressure difference between the inside and the outside of the displacer may be approximately 1 atm; under a normal conducting state (quenching), the pressure difference may be approximately 2 atm.

The rigidity or strength of the displacer may be selected taking into consideration that the gas pressure difference between the inside and the outside of the displacer under different conditions (e.g., superconducting or quenching) may be different. In one example, the displacer may be made of a material with a certain strength or rigidity. Exemplary materials may include copper, aluminum, stainless steel, or the like, or an alloy thereof, or a combination thereof. In another example, one or more supporting elements 31 may be formed inside the displacer to enhance the rigidity or strength of the displacer. The number of the supporting elements 31 in a displacer may be greater than 1. The supporting elements 31 may be mounted or welded anywhere inside the displacer, such as on the inner-upper surface, the inner-lower surface, the inner-side surface, or the like, or a combination thereof. Alternatively, the supporting elements 31 may also be mounted or welded on the outside of the displacer.

The thermal mass of the superconducting magnet system may be increased by the inclusion of one or more displacers. A material of an appropriate thermal capacity or thermal mass may be used to form a displacer. Extra thermal mass may need extra cryogen to cool it down, and in turn may better maintain the temperature of the superconducting magnet system or prevent the temperature of the superconducting magnet system from increasing. Merely by way of example, the inner cavity may contain a certain amount of gas, e.g., helium gas, nitrogen gas, hydrogen gas, air, or the like, or a combination thereof. The gas pressure inside the displacer may change depending on the temperature outside of the displacer. Furthermore, a heat transfer may occur between the gas inside the displacer and the cryogen outside the displacer by, e.g., conduction across the surface of the displacer. The gas inside the displacer may have a thermal capacity different from the thermal capacity of the liquid cryogen outside of the displacer. Merely by way of example, the thermal capacity of the gas may be higher than the thermal capacity of the liquid cryogen. In this situation, when the temperature of the superconducting magnet increases, e.g., during power-off, transportation, or quenching, the displacer may absorb more heat than the cryogen with a same mass, which would reduce the rate at which the temperature increases. In some embodiments, the displacer may be filled with a filler including, e.g., silane-coated soda glass spheres, sand, gravel, scrap epoxy resin, a scrap composite material, or the like, or a combination thereof.

One or more displacers may be mounted inside the storage cavity (e.g., 211 or 301). In some embodiments, the displacers may be mounted onto the coil framework 21 with one or more contact points. The contact points may be minimum and sufficient to maintain the attachment of the displacer onto a support structure, e.g., the coil framework 21, the thermal shielding housing 202, the outer housing 203, or the inner housing 209, or the like, or a combination thereof. For example, one or more threaded studs may be mold on the outside surface of a displacer and used to attach the displacer to a support structure, e.g., the coil framework 21, the thermal shielding housing 202, the outer housing 203, or the inner housing 209, or the like, or a combination thereof. Alternatively, a threaded insert may be mold into a displacer, with a bolt passing into the insert to attach the displacer to a support structure. In some embodiments, the displacer may be welded onto the outer housing 203, or the thermal shielding housing 202 outside the outer housing 203. The displacer may be in thermal contact with a support structure including, for example, the outer housing 203, or the thermal shielding housing 202 outside the outer housing 203, the inner housing 209, or the like, or a combination thereof.

This description is intended to be illustrative, many alternatives, modifications, and variations will be apparent to those skilled in the art. The features, structures, methods, and other characteristics of the exemplary embodiments described herein may be combined in various ways to obtain additional and/or alternative exemplary embodiments.

FIG. 5-A to FIG. 5-C show exemplary displacers with different shapes according to some embodiments. FIG. 5-A is an example of a tubular displacer according to some embodiments of the present disclosure. It should be appreciated by those skilled in the art that the configuration of the displacer may not be limited to essentially cylindrical, configurations according to other embodiments may include, e.g., essentially cuboid, essentially ellipsoid, essentially sphere, or the like, or a combination thereof. The tubular displacer 500 may include an outer wall 501, an inner wall 502, an end wall 503, and an end wall 504. In some embodiments, the inner wall 502 may coaxially surround the inner housing 209 illustrated in FIG. 2. In some embodiments, the inner wall 502 may be unnecessary. In some embodiments, the thickness of the tubular displacer 500, i.e., the dimension in the radial direction between the outer wall 501 and the inner wall 502, may be small. For instance, the difference between the diameter of the outer wall 501 and the diameter of the inner wall 502 may be small, or the displacer is a sheet-rolled-cylinder.

The displacer 500 may be solid or hollow. In some embodiments, the cavity 506 of a hollow displacer 500 may store at least one kind of cryogen including, e.g., a liquid cryogen (e.g., liquid nitrogen, liquid nitrogen, or the like), a solid cryogen (i.e., solid nitrogen, or the like), a cryogenic gas (e.g., a cryogenic gas boiled-off from a liquid cryogen), or the like, or a combination thereof. If the displacer 500 is hollow, a support structure 505 may exist between the end wall 503 and the end wall 504. The outer wall 501 and the inner wall 502 may be formed by a single piece of material, or from several parts (e.g., rolled plates welded together). In some embodiments, a coil may be arranged or supported on the surface of a displacer 500. Merely by way of example, the outer wall 501 may be used as a bucking coil former described in connection with FIG. 3. It should be appreciated by those skilled in the art that a hole may exist on any one of the walls described herein, or a tube and/or pipe may exist in any one of the cavities described herein.

In some embodiments, the difference between the outer diameter and the inner diameter of the end wall 503 and/or the difference between the outer diameter and the inner diameter of the end wall 504 may be extremely small in the radial direction. In some embodiments, the difference may range from 0.5 millimeters to 15 millimeters, or from 1 millimeter to 10 millimeters, or from 2 millimeters to 7 millimeters, or from 2.5 millimeters to 5 millimeters. In some embodiments, the displacer may be formed of a sheet-rolled-cylinder. The sheet-rolled-cylinder displacer may be used to form a storage reservoir with the coil former for accommodating the superconductive coil. The sheet-rolled-cylinder displacer may also be used to form a storage reservoir with the coil former for accommodating the bucking coil. The storage reservoir may contain at least one kind of cryogen including a liquid cryogen (e.g., liquid nitrogen, liquid nitrogen, or the like), a solid cryogen (e.g., solid nitrogen, or the like), a cryogenic gas (e.g., a cryogenic gas boiled-off from a liquid cryogen), or the like, or a combination thereof.

FIG. 5-B shows some embodiments of a C-shape displacer. Similar to the displacer 500 illustrated in FIG. 5-A, the C-shape displacer 510 may include an outer wall 501, an inner wall 502, an end wall 503, and an end wall 504. In some embodiments, the inner wall 502 may coaxially surround the inner housing 209 illustrated in FIG. 2. The C-shape displacer 510 may further include a section 511, a section 512, and an opening between the section 511 and the section 512. A component, e.g., an electronic component related to magnetic field generation, may be installed in the opening. The opening angle of the displacer may range from 0 degree to 180 degrees. In some embodiments, the opening angle may be approximately 60 degrees. The opening angle may refer to the angle formed between the radii (on a same cross-section of the displacer) between the center of the displacer and two ends of the opening on the inner wall. In some embodiments, the length of the opening may be the same as or shorter than the circumference of the C-shape. For example, the length of the opening may be approximately 2%, or 5%, or 8%, or 10%, or 15%, or 20%, or 25%, or 30%, or 35%, or 40%, or 45%, or 50%, or 55%, or 60%, or 65%, or 70%, or 75%, or 80%, or 85%, or 90%, or 95%, or 98%, or the same as the circumference of the C-shape. In some embodiments, the length of the opening may be longer than the circumference of the C-shape. For example, the length of the opening may be approximately 105%, or 110%, or 115%, or 120%, or 125%, or 130%, or 135%, or 140%, or 145%, or 150%, or 155%, or 160%, or 165%, or 170%, or 175%, or 180%, or 185%, or 190%, or 195%, or 200%, or longer than 200% of the circumference of the C-shape.

The displacer 510 may be solid or hollow. If the displacer 510 is hollow, the displacer 510 may include a displacer cavity. In some embodiments, the displacer cavity may store at least one kind of a cryogen including, e.g., a liquid cryogen (e.g., liquid nitrogen, liquid nitrogen, or the like), a solid cryogen (e.g., solid nitrogen, or the like), a cryogenic gas (e.g., a cryogenic gas boiled-off from a liquid cryogen), or the like, or a combination thereof. If the displacer is hollow, a support structure may exist between the end wall 503 and the end wall 504. The outer wall 501 and inner wall 502 may be formed from a one-piece part or from several parts (e.g., rolled plates combined together). In some embodiments, the outer wall 501 may be used as the bucking coil former described in FIG. 3. It should be appreciated by those skilled in the art that any hole may exist on any walls described herein and any tube and/or pipe can exist in any cavities described herein.

In some embodiments, the difference between the outer diameter and the inner diameter of the end wall 503 and/or the difference between the outer diameter and the inner diameter of the end wall 504 may be extremely small in radial direction, as illustrated in FIGS. 5-A and 5-B. The sheet-rolled-C-shape-cylinder displacer may be used to build a storage reservoir with the coil former for accommodating the conductive coil incompletely. The sheet-rolled-C-shape-cylinder displacer may also be used to form a storage reservoir with the coil former for accommodating at least part of the bucking coil. The storage reservoir may contain at least one kind of a cryogen including, e.g., a liquid cryogen (e.g., liquid nitrogen, liquid nitrogen, or the like), a solid cryogen (e.g., solid nitrogen, or the like), a gaseous cryogen (e.g., a gaseous cryogen boiled-off from a liquid cryogen), or the like, or a combination thereof.

The C-shape displacer 510 may be formed by two or more parts. As illustrated in FIG. 5-C, the displacer 510 may include a section 521 and a section 522. This exemplary configuration of the displacer 510 may allow convenient installation. In some embodiments, at least two or more sections of the displacer 510 may be thermally insulated from each other. Merely by way of example, two sections of the displacers 510 may be separated from each other by a thermally insulating material. In some embodiments, at least two or more sections of the displacer 510 may be in thermal contact with each other. Merely by way of example, two sections of the displacer 510 may be in physical contact with each other. In another example, the thermally contact may be formed via a thermally conductive material connecting the two sections. Heat transfer may occur between the two sections. Heat transfer may occur with or without matter transfer (e.g., a fluid flows from one section to another). In some embodiments, at least two or more parts of the displacer 510 may be in no fluid communication with each other. In some embodiments, at least two or more sections of the displacer 510 may be in fluid communication with each other. Merely by way of example, each of two sections of the displacer 510 may have cavities filled at least partially with a fluid (e.g., a liquid or a gas), and the fluid in one section may flow to the other section. It should be noted that FIG. 5-C shows one way to divide the displacer in the direction of axis of the displacer while it may be also divided in the direction of the radius. It should be appreciated by those skilled in the art that number and shape of the displacer are not limited to the embodiments mentioned hereinabove. For example, a displacer may be divided into three or more sections. As another example, the shape of the displacer may be ellipsoid, cuboid, or the like, or a portion thereof.

Configurations of a displacer including, e.g., the number of sections, their respective positions, or the like, or a combination thereof, may be adjusted based on various considerations. Exemplary considerations may include the design of the superconductive coil, the size of the first housing 201, the size of the outer housing 203, or the like, or a combination thereof. It should be noted that FIGS. 5-A to 5-C show exemplary displacer configurations between the outer housing 203 and the inner housing 209 when the radius of the displacer inner wall 502 is large enough for the displacer to enclose (e.g., completely or partially) the inner housing 209 coaxially.

FIGS. 6-A and 6-B show exemplary displacer layouts according to some embodiments of the present disclosure. The exemplary displacer layout may be placed between, e.g., the outer housing 203 and the inner housing 209. The number of displacers 606 may be one or more. One or both of the two end walls of the displacer 606 may connect to or cross through the outer housing 203. In some embodiments, at least two or more displacers 606 may be thermally insulated from each other. Merely by way of example, each of two displacers 606 may be separated from each other by a thermally insulating material. In some embodiments, at least two or more displacers 606 may be in thermal contact with each other. Merely by way of example, each of two displacers 606 may be in physical contact with each other. In another example, the thermal contact may be formed via a thermally conductive material connecting the two displacers 606. Heat transfer may occur between the two displacers 606. Heat transfer may occur with or without mass transfer (e.g., a fluid flowing from one section to another). In some embodiments, at least two or more displacers 606 may be in no fluid communication with each other. In some embodiments, at least two or more displacer 606 may be in fluid communication with each other. Merely by way of example, each of two displacers 606 may have cavities filled at least partially with a fluid (e.g., a liquid or a gas), and the fluid in one displacer may flow to the other displacer. Meanwhile, both of the two end walls of a displacer may also connect to or cross through the thermal shielding housing 202. If multiple displacers exist, the axes of displacers may be parallel to each other or not parallel to each other. In some embodiments, parallel axes of displacers may provide stability in the mechanical structure. In some embodiments, the axes of the displacers may be perpendicular to or parallel to the axial direction of the superconducting magnet system or device.

In some embodiments as illustrated in FIG. 6-A, the displacer 606 may extend between and/or be connected to the ends of the outer housing 203. A support structure 601 may be placed between the inner housing 209 and the outer housing 203 for providing mechanical stability. In some embodiments, the support structure 601 may include a spike between the inner housing 209 and the outer housing 203. The displacer 606 may be installed between the inner housing 209 and the outer housing 203. In some embodiments, a displacer 606 may be placed between two support structures 601. The axis of the displacer 606 may be parallel to the axial direction of the superconducting magnet system or device. The number of sections in the displacer 606 may be based on, e.g., the size of the cross-section of the displacer 606 and the size of the cross-section of the space between the outer housing 203 and the inner housing 209. It should be appreciated by those skilled in the art that the shape of the cross section of the displacer 606 may be other than essentially circular. Along the axis of the displacer 606, the displacer 606 may be straight or curving. In some embodiments, a straight cylindrical displacer may be easy to manufacture and may have an optimal stress state. In some embodiments, the displacer 606 may be in the form of a channel at least partially through the outer housing 203 and/or the inner housing 209. The channel may include at least two ends and at least one side wall. At least one end may be an opening that intersects with the outer housing 203 and/or the inner housing 209. The axis of the displacer 606 may be a line that connects the two centers of the two ends. For example, if the two ends are two openings that intersect with the outer housing 203 and/or the inner housing 209 (as will be described in FIG. 6-B, the axis of the displacer 606 may be a line that connects the two centers of the two openings.

In some embodiments as illustrated in FIG. 6-B, a displacer 606a or 606b may be connected to the outer housing 203. The displacer 606a and/or 606b may be installed between the inner housing 209 and the outer housing 203. In some embodiments, the axis of the displacer 606a and/or 606b may be perpendicular to the axial direction of superconducting magnet system or device. As used herein, the axis of the displacer 606a or 606b is a line that connects two centers of the two ends of the displacer 606a or 606b. In some embodiments, the axis of the displacer 606a and the axis of the displacer 606b may be at an angle other than zero or 180 degrees to the axial direction of the superconducting magnet system. In some embodiments, the axis of the inner housing 209 may be parallel to the axial direction of the superconducting magnet system or device. In some embodiments, the axis of the outer housing 203 may be parallel to the axial direction of the superconducting magnet system or device. In some embodiments, the axis of the displacer 606a and/or 606b may be at an angle other than zero or 180 degrees to each other. In some embodiments, the axis of the displacer 606a and/or 606b may be at an angle of 90 degrees to each other. In some embodiments, the axis of the displacer 606a and/or 606b may be at an angle other than 90 degrees to each other. It should be appreciated by those skilled in the art that the shape of the cross-section of the displacer 606 may be of a shape other than essentially circular. In the direction of the length direction of the displacer, the displacer may be straight or curved.

FIG. 7-A illustrates an exemplary cryogen reservoir according to some embodiments of the present disclosure. The superconducting coil 703 may include two tail-end coils 703a, two side coils 703b, two middle coils 703c, a central coil 703d, and two bucking coil 703e. The inner coil former 701 and a displacer 705a may be connected together to form a first reservoir 707a. The inner coil former 701 and a displacer 705b may be tightly sealed together to form a second reservoir 707b. The inner coil former 701 and a displacer 705c may be tightly sealed together to form a third reservoir 707c. In an example, the displacers 705a, 705b, and 705c may be spaced apart from each other, and the first reservoir 707a, the second reservoir 707b, and the third reservoir 707c may be isolated from each other. In another example, the displacers 705a, 705b, and 705c may form a single piece of displacer, and an integral reservoir may be formed between the single piece of displacer and the inner coil former 701. In still another example, the displacers 705a, 705b, and 705c may be spaced apart from each other, but the first reservoir 707a, the second reservoir 707b, and the third reservoir 707c may be connected to (e.g., in fluid communication with) each other. Merely by way of example, the first reservoir 707a may be connected to the second reservoir 707b via a tunnel 710a, and the second reservoir 707b may be connected to the third reservoir 707c via a tunnel 710b. An integral reservoir may include the first reservoir 707a, the second reservoir 707b, the third reservoir 707c, and the tunnels 710a and 710b. A liquid cryogen, e.g., liquid helium, may flow within the integral reservoir formed by the first reservoir 707a, the second reservoir 707b, and the third reservoir 707c to have the respective superconducting coils cooled.

A second reservoir 706 may accommodate the bucking coil 703e and the outer coil former 702. The second reservoir 706 may be formed by a hollow torus shaped displacer 708 that may keep the liquid cryogen inside the second reservoir 706. The displacer 708 may have an opening angle which may vary from approximately 0 degree to 180 degrees. In some embodiments, the opening angle may be approximately 60 degrees. In some embodiments, the length of the opening may be longer than the circumference of the displacer. In some embodiments, the length of the opening may be the same as or shorter than the circumference of the displacer. A connecting point 730 may be employed to exchange the liquid cryogen between the second reservoir 706 and another liquid cryogen containing part including, e.g., the first reservoir 707a, the second reservoir 707b, the third reservoir 707c, a cryogen buffering tank (not shown in FIG. 7), or the like, or a combination thereof. It shall be noted that coils immersed in the reservoirs 706, 707a, 707b, or 707c may be cooled by the liquid cryogen contained in the respective reservoirs, while coils not immersed in the liquid cryogen may be cooled by a gaseous cryogen boiled-off from the liquid helium. A same or different materials may be used to make displacers 705a, 705b, 705c, and coil formers 701 and 702. Exemplary materials suitable for making the cryogen buffering tank 104 may include copper, aluminum, stainless steel, or a composite thereof, or the like, or a combination thereof.

FIG. 7-B shows an exemplary cryogen storage reservoir formed by a displacer and other structures in the system. The displacer 705a may be attached to the coil former (e.g., a main coil former 410 or a bucking coil former 411) to form the storage reservoir 707a. The attachment may be achieved using, e.g., a cold resistant glue that may maintain leak-proofness in a low temperature like that in a relevant operation condition. Furthermore, the displacer 705a may have a groove structure 711 and a hoop 720. The groove structure may increase the adhesive area and neutralize or reduce stress generated by shrinkage of one or more structures that form the leakproof connection under a low temperature like that in a relevant operation condition. Other fastening structures including, e.g., a hoop, may be used alternatively or additionally to provide or improve leak-proofness of the storage reservoir 707a. Exemplary cold resistant glue may include an epoxy glue, a mixture of epoxy glue and one or more other components, e.g., methyl methacrylate, methacrylic acid, neoprene, or the like, or a combination thereof. It should be appreciated by those skilled in the art that other cold resistant glues may also be used. In some embodiments, the displacer 705a may be welded on the coil former directly.

FIG. 8-A shows an exemplary configuration of a displacer according to some embodiments of the present disclosure. A pair of symmetrical cut-through holes 812 may be formed by cutting the outer housing 203. After assembling the superconductive magnet and the cryogen container, the displacer 813 may be inserted through the pair of symmetrical cut-through holes 812. Each end of the displacer 813 may form a welding groove with a single cut-through hole 812. An end of the displacer 813 may match the shape of the cut-through hole to avoid the formation of a bulge or a protrusion after welding the displacer 813 and the outer housing 203 together. After welding the displacer 813 and the outer housing 203 together, the cryogen container may be divided into two parts, the cavity 814 as illustrated in FIG. 8-B used for housing the cryogen in which superconductive coils are immersed and the cavity 815 in the displacer 813. It should be noted that after welding the displacer 813 and the outer housing 203 together, the cut-through hole 812 may be completely sealed or isolated from the cavity 814. As described elsewhere in the disclosure, the axis of the displacer 813 is a line that connects two centers of two end holes of the displacer 813.

A tube 817, as illustrated in FIG. 8-B, may connect the cavity 815 to a refill hole 819. The cavity 815 may be provided in fluid communication with a pump, a cryogen storage device, or a cryorefrigerator that includes a recondenser. The tube 817 may include a valve 818. The amount of pre-filled cryogen may be adjusted based on, e.g., the time it may take to transport and/or install an MRI system, which in turn may depend on the distance of the transportation. In some embodiments, e.g., if the transportation time is short (e.g., due to a short transportation distance) and the cryogen in the cavity 814 meets the cooling requirement, the cavity 815 may be vacuumed via the tube 817. Thus, the consumption of cryogen may be low and the conductive coil may remain at a low temperature. In some embodiments, e.g., if the transportation time is long (e.g., due to a long transportation distance) and the cryogen in the cavity 814 is insufficient to meet the cooling requirement, before the MRI system is ready for delivery, cryogen may be filled into the cavity 815 via the tube 817. The cryogen in the cavity 815 may also be used to cool the cavity 814. The cryogen in the cavity 815 may be the same as or different from the cryogen in the cavity 814. In some embodiments, e.g., if the transportation time is extremely long (e.g., due to an extremely long transportation distance), pre-filling the cavity 815 with cryogen like liquid helium may be insufficient to negate the risk that superconductive coils may be warmed-up. In this situation, before the MRI system is ready for delivery, a cryogen whose thermal capacity is bigger than that of the cryogen filled in the cavity 814 may be filled into the cavity 815. For example, liquid nitrogen may be filled into the cavity 815 while liquid helium may be filled into the cavity 814. The cryogen in the cavity 815 may absorb extra heat to maintain the low temperature of the MRI system. Thus the delivery distance may be extended.

FIG. 8-C shows an exemplary layout of the tube 817 according to some embodiments of the present disclosure. The tube 817 may be in thermal contact the thermal shielding housing 202. The contact area may be increased by wrapping the tube 817 around the thermal shielding housing 202 in, e.g., the longitudinal direction and/or the radial direction. The tube 817 may be made of or include a thermally conductive material. Exemplary materials may include copper, aluminum, stainless steel, or the like, or an alloy thereof, or a combination thereof. The cryogen flowing in the tube 817 may be used to cool the thermal shielding housing 202. The increased contact area may increase the heat exchange between within the thermal shielding housing 202 and the cryogen in the tube 817. This may allow more heat to be carried away by the cryogen in the tube 817 before the cryogen exits the system or before it is re-cooled in, e.g., a refrigeration procedure.

FIG. 8-D shows an exemplary displacer structure according to some embodiments of the present disclosure. The displacer 205 may be a torus with an opening angle. The opening angle may range from 0 degree to 180 degrees. In some embodiments, the opening angle of the displacer may be approximately 60 degrees. In some embodiments, the length of the opening may be longer than the circumference of the displacer. In some embodiments, the length of the opening may be the same as or shorter than the circumference of the displacer. The displacer may include at least one bonding fixing hole and/or a groove bonding structure.

FIG. 8-E shows an exemplary structure of a hoop 720. The hoop 720 may be used to improve the leakproofness of the storage reservoir as described elsewhere in the disclosure. The hoop 720 may include a circular-arc shape fastener 801, a circular-arc shape fastener 802, and an elastic structure 803. The fastener 801 may be connected to the fastener 802 via the elastic structure 803. The elastic structure 803 may include a screw and one or more resilient pads. If sufficient pretension force is provided on the elastic structure 803, the hoop 720 may provide the displacer 205 enough clamping force to offset the thermal stress of the bonding and sealing that may be caused by cooling. The hoop 720 may be wrapped around the displacer to further improve leakproofness of the storage reservoir.

While the present invention has been described in detail to some extent with reference to the preferred embodiments thereof, it will be understood by those skilled in the art that various changes in form and details may be made therein without departing from the spirit and scope of the present invention.

EXAMPLES

The following examples are provided for illustration purposes, and not intended to limit the scope of the present disclosure.

Example 1

FIG. 9-A is a longitudinal section view of an exemplary cryostat according to some embodiments of the present disclosure. A cryostat 930, a multi-layer cylinder, may include an outer vacuum tank 901, a shielding housing 902, and an inner tank 903. The inner tank 903 may be used to contain a cryogen. Superconductive coils may be located in the inner tank 903 and immersed at least partially in the cryogen contained in the inner tank 903. Exemplary cryogens used herein may include a liquid cryogen (e.g., liquid nitrogen, liquid nitrogen, or the like), a solid cryogen (e.g., solid nitrogen, or the like), and a gaseous cryogen (e.g., a gaseous cryogen boiled-off from a liquid cryogen), or the like, or a combination thereof. In some embodiments, the superconductive coils may include bucking coils 904 and main coils 905. The bucking coils 904 may be arranged on a bulge on either end of the coil framework, and the main coils 905 may be arranged close to the center the inner tank 903. The radius or size of the structure (e.g., a bucking coil former) on which the bucking coils 904 are supported may be bigger than the radius or size of the structure (e.g., a main coil former) on which the main coils 905 are supported, thus the cavity where the main coils are located in the inner tank 903 may be large.

FIG. 9-B is the cross-sectional view of an exemplary cryostat. As illustrated in FIG. 9-B, a displacer 906 may be located in the inner tank 903, and the wall of the displacer 906 may be part of the inner tank 903. The cryostat may also include a pipe 907. The wall of the pipe 907 may be part of the shielding housing 902. In some embodiments, at least a part of the pipe 907 may be located below the horizontal central plane of the shielding housing 902. The pipe 907 may have a shape other than cylinder as showed in the figure. A curved tube may also be used herein for increasing the heat exchange area of the cryogen and the shielding housing 902.

Between the outer vacuum tank 901 and the inner tank 903 may be a vacuumed cavity. A first cavity may be located between the outer vacuum tank 901 and the shielding housing 902. A second cavity may be located between the shielding housing 902 and the inner tank 903. The pipe 907 may be located between the first cavity and the second cavity. It should be noted that both ends of the pipe 907 may be sealed or fluidly isolated from the inner tank 903 and connected with (e.g., in fluid communication with) tube 908 and/or tube 909 described below.

As illustrated in FIG. 9-B, the cryostat may also include a first tube 908 and a second tube 909. One end of the first tube 908 may be located above the cryogen fill level of the inner tank 903 and may pass through the inner tank 903 and shielding housing 902, connecting to the interior of the inner tank 903. The other end of the first tube 908 may pass through the shielding housing 902 and the sealed part of the pipe 907, connecting to the interior of the pipe 907. One end of the second tube 909 may pass through the shielding housing 902 and the sealed part of the pipe 907, connecting to the interior of the pipe 907. The other end of the second tube 909 may pass through the outer vacuum tank 901, connecting to (e.g., in fluid communication with) the exterior of a cryostat (not shown in FIG. 9-B). The tubes 908 and 909 may be placed in a vacuum condition, the mechanical strength of the tubes 908 and 909 may be at least one bar.

To increase the area where the heat exchange between the shielding housing 902 and the cryogen, the diameter of the pipe 907 may be larger than the diameter of the first tube 908 and/or the second tube 909. Furthermore, a heat exchange plate may be placed in the pipe 907 for enhancing the heat exchange between cryogen and the shielding housing 902.

The cryostat may include a cryocooler 911. The cryocooler 911 may be placed above the cryogen fill level of the inner tank 903. The cryocooler 911 may have at least two stages for cooling respective parts of the system. For example, one stage with a temperature of approximately 4.5K may be used for cooling the inner tank 903, while the other stage with a temperature of approximately 40K to 70K may be used for cooling the shielding housing 902.

It shall be appreciated by those having ordinary skills in the art that the number of the displacers located in the inner tank 903 and pipe located in the displacer may not be limited to the disclosure herein. For example, multiple displacers may exist in the inner tank 903, and each displacer may has a pipe connecting to it. The pipes may connect to each other to form connected space while the first tube and the second tube may connect to both ends of the connected space.

An exemplary process for cooling the cryostat is provided. The superconductive magnet may be pre-cooled by a cryogen including, e.g., liquid helium or liquid nitrogen. The cryogen may be filled into the inner tank 903 via the filling hole 924. If the cryogen is boiled off, the gaseous cryogen may pass through the first tube 908 and the second tube 909, and may escape from the tank 903 via a hole 925 which is at one end of the second tube 909. Meanwhile, when the MRI system is transported to a long distance, since the cryocooler 911 may not work during the transportation, the cryogen in the inner tank 903 may vaporize. The gaseous cryogen may remain at a low temperature and flow in the first tube 908 and the second tube 909. This flow of the cold gaseous cryogen in the tubes may slow down the temperature rise in the shielding housing 902, allowing an extended delivery distance. When the MRI system is transported to an extremely long distance, a cryogen, e.g., liquid nitrogen with a boiling point of approximately 70 k, may be pre-filled in the pipe 907 and close the filling hole 924. During transportation, the liquid nitrogen may vaporize, e.g., before or concurrently with the vaporization of the liquid cryogen outside of the pipe 907, and the temperature rising of the shielding housing 902 may be slowed down. During the operation of the MRI system, the filling hole 924 and the hole 925 may be closed. The hole 925 may be connected to one stage of the cryocooler 911. The cryocooler 911 may be maintained at a temperature approximately 4.5K.

An exemplary process for manufacturing a cryostat is provided. The cryostat may include an inner tank 903 and a shielding housing 902. The shielding housing 902 may surround the inner tank 903. The cryostat may also include a pipe 907, a tube 908, and a tube 909. The inner tank 903 may include two end walls, an inner wall, and an outer wall. First a displacer may be set in the inner tank 903. In some embodiments, the displacer may be affixed to the inner wall and/or outer wall of the inner tank 903. In some embodiments, the displacer may be affixed to the ends of the inner tank 903. Two cut-through holes may be created on the shielding housing 902. The diameter of a cut-through hole formed on the shielding house 902 may be smaller than the diameter of the displacer's end. See, e.g., FIG. 9-B. The pipe 907 may be placed in the displacer and pass through both cut through holes. Then the ends of the pipe 907 and the ends of the cut-through holes on the shielding house 902 may be sealed. The sealed part of the pipe 907 may be or fused with part of the shielding housing 902. Finally the inner tank 903 and the pipe 907 may be connected with the tubes 908 and 909. One end 922 of the first tube 908 may be located above the cryogen fill level of the inner tank 903 and may pass through the inner tank 903 and the shielding housing 902, protruding into the interior of the inner tank 903. The other end of the first tube 908 may pass through the shielding housing 902 and the sealed part of the pipe 907, connecting to the interior of the pipe 907. One end of the second tube 909 may pass through the shielding housing 902 and the sealed part of the pipe 907, connecting to the interior of the pipe 907. The other end of the second tube 909 may pass through the outer vacuum tank 901, connecting to the exterior of the cryostat.

Another exemplary process for manufacturing a cryostat is provided. The cryostat may include an inner tank 903 and a shielding housing 902. The shielding housing 902 may surround the inner tank 903. The cryostat may also include a pipe 907, a tube 908, and a tube 909. The inner tank 903 may include two end walls, an inner wall, and an outer wall. First a displacer may be set in the inner tank 903. In some embodiments, the displacer may be affixed to the inner wall and/or the outer wall of the inner tank 903. In some embodiments, the displacer may be affixed to the ends of the inner tank 903. Two cut-through holes may be created on the shielding housing 902. The diameter of a cut-through hole formed on the shielding housing 902 may be smaller than the diameter of the displacer's end. See, e.g., FIG. 9-B. The ends of the pipe 907 may be sealed. The sealed pipe 907 may be placed inside the displacer through the cut-through holes. Then the cut-through holes may be sealed. Finally the inner tank 903 and the pipe 907 may be connected with the tubes 908 and 909. One end of the first tube 908 may be located above the cryogen fill level of the inner tank 903 and may pass through the inner tank 903 and the shielding housing 902, protruding into the interior of the inner tank 903. The other end of the first tube 908 may pass through the shielding housing 902 and the sealed part of the pipe 907, connecting to the interior of the pipe 907. One end of the second tube 909 may pass through the shielding housing 902 and the sealed part of the pipe 907, connecting to the interior of the pipe 907. The other end of the second tube 909 may pass through the outer vacuum tank 901, connecting to the exterior of the cryostat. It should be noted that order of specific steps is not limited to the embodiments mentioned hereinabove.

Example 2

FIG. 10-A illustrates an exemplary superconducting magnet system according to some embodiments of the present disclosure. The superconducting magnet system 1000 may include at least two liquid helium tanks, a first tank 1003 of a volume of approximately 1500 L, and a second tank 1006 of a volume of approximately 100 L. The first tank 1003 may be housed in a vacuum chamber 1001. One or more thermal shielding housings 1002 may be provided between the first tank 1003 and the vacuum chamber 1001. The second tank 1006 may be housed within and in fluid communication with the first tank 1003. A tube, for example, connected by tubes 1007a, 1007b, may connect the second tank 1006 to a helium buffering tank 1004 and a superconducting switch storage box 1009, e.g., a fluid communication may be provided between a second tank 1006 and a helium buffering tank 1004 via a tube 1007. A superconducting magnet 1005 may be immersed in the liquid helium 1011 within the second tank 1006. A refrigerator 1016 configured with at least two cooling stages may be located in a chamber 1015. One cooling stage may cool the thermal shielding housing 1002 to approximately 40-70K. The other cooling stage, with the cooling temperature of approximately 4.5K, may condense the boiled-off helium 1013 into the liquid state before it flows back to the helium buffering tank 1004 by a cotton string 1012. The helium buffering tank 1004 may be mounted on the supporting structure for the bucking coil former, having the volume of approximately 100 L. Exemplary materials making the helium buffering tank 1004 may include copper, aluminum, stainless steel, or composite, or the like. Under certain conditions, the helium buffering tank 1004 may compensate the consumption of liquid helium in the second tank 1006. The superconducting magnet structure 1100 may include an inner coil former 1101, an outer coil former 1102 connecting to the inner coil former 1101 by a supporting structure 1104.

A perspective view of the superconducting magnet structure is shown in FIG. 10-B. The superconducting magnet structure 1100 may include an inner coil former 1101, an outer coil former 1102 connecting to the inner coil former 1101 by a supporting structure 1104. A superconducting coils 1103 may be arranged on the inner coil former 1101 and the outer coil formers 1102. A first reservoir 1107 may be formed by the inner coil former 1101 and a displacer 1105. Heat transfer may occur between the stored liquid helium and superconducting coils to keep the superconducting state of the coils. A second reservoir 1106a (or 1106b) may be formed by a displacer 1108a (or 1108b) wrapping around at least part of the outer coil former 1102a (or 1102b). The displacer 1108a or 1108b may be an integral piece. The displacer 1108a or 1108b may be attached onto the outer coil former 1102a or 1102b. The displacer 1108a or 1108b may be formed by a plurality of components.

FIG. 10-C illustrates a cross-section view of the superconducting magnet structure below the central axis of FIG. 10-B according to some embodiments of the present disclosure. A superconducting coil may include two tail-end coils 1103a, two middle coils 1103c, a central coil 1103d, and two bucking coils 1103e. The inner coil former 1101 and a displacer 1105a may be tightly sealed together to form a first reservoir 1107a. The inner coil former 1101 and a displacer 1105b may be sealed together to form a second reservoir 1107b. The inner coil former 1101 and a displacer 1105c may be tightly sealed together to form a third reservoir 1107c. In an example, the displacers 1105a, 1105b, and 1105c may be isolated, and the first reservoir 1107a, the second reservoir 1107b and the third reservoir 1107c may be isolated from each other. In another example, the displacers 1105a, 1105b, 1105c may construct a single piece of displacer, and thus an integral reservoir may be formed between the single piece of displacer and the inner coil former 1101. In still another example, the displacers 1105a, 1105b, 1105c may be isolated, but the first reservoir 1107a, the second reservoir 1107b and the third reservoir 1107c may be connected to (e.g., in fluid communication with) each other, i.e., the first reservoir 1107a may connect to the second reservoir 1107b via a tunnel 1201a, and the second reservoir 1107b may connect to the third reservoir 1107c via a tunnel 1201b.

An integral reservoir may include the first reservoir 1107a, the second reservoir 1107b, the third reservoir 1107c, and the tunnels 1201a and 1201b. A liquid cryogen, e.g., liquid helium, may flow within the integral reservoir formed by the first reservoir 1107a, the second reservoir 1107b, and the third reservoir 1107c to have the respective superconducting coils cooled. A second reservoir 1106a (or 1106b) may enclose the bucking coil 1103e and the outer coil former 1102a (or 1102b). The second reservoir 1106a (or 1106b) may be formed by a hollow torus shaped displacer 1108a (or 1108b) that may keep the liquid cryogen inside the second reservoir 1106a (or 1106b). The displacer 1108a or (1108b) may have a C-shape. The C shape may have an opening angle ranging from approximately 0 degree to 180 degrees. In some embodiments, the opening angle may be approximately 60 degrees. In some embodiments, the length of the opening of the C-shape may be longer than the circumference of the displacer. In some embodiments, the length of the opening may be the same as or shorter than the circumference of the displacer. A connecting point 1203 may be employed to exchange the liquid cryogen between the second reservoir 1106a (or 1106b) and another liquid cryogen containing part, such as the first reservoir 1107a, the second reservoir 1107b, the third reservoir 1107c, the cryogen buffering tank 1004, or the like, or a combination thereof. It shall be noted that coils immerged in the reservoirs 1106a, 1106b, 1107a, 1107b, and 1107c may be cooled by the liquid helium contained in the respective reservoir, while coils not immerged in the liquid helium may be cooled by boiled-off gas from the liquid cryogen. A same or different materials may be used to form displacers 1105a, 1105b, 1105c (as described in FIG. 8-D), 1106a (or 1106b), and coil forms 1101 and 1102a (or 1102b). Exemplary materials suitable for making the cryogen buffering tank 1004 (shown in FIG. 10-A) may include copper, aluminum, stainless steel, or the like, or an alloy thereof, or a combination thereof.

Referring back to FIG. 10-A, the superconducting switch 1008 may be placed at the bottom of the superconducting switch storage box 1009. The storage box 1009 may be made of a nonmagnetic material including, e.g., aluminum, stain steel, or the like, or a composite thereof, or a combination thereof. The storage box 1009 may be in fluid communication with the second tank 1006 through the stainless steel tube 1007a. The storage box 1009 may also be in fluid communication with the helium buffering tank 1004. In some embodiments, the helium buffering tank 1004, the superconducting switch storage box 1009, and the second tank 1006 may be in fluid communication with each other. Thus, the superconducting switch 1008 may remain immersed in the liquid helium under the superconducting condition.

A fixed mount 1010 of a superconducting line may be wrapped in the tube 1007b. The fixed mount 1010 may include several stainless steel bars welded or connected with each other. The two ends of the fixed mount 1010 may be fixed on the superconducting switch storage box 1009 and the helium buffering tank 1004, respectively. The outgoing line of the superconducting switch 1008 may be tied or connected to the fixed mount 1010, lead to the helium buffering tank 1004, and connect to the superconducting wire connector of the superconducting coils. The helium buffering tank 1004 may be mounted on the support structure 1104. The helium buffering tank 1004 may be made of stainless steel. The helium buffering tank 1004 may have a volume of approximately 100 L. The helium buffering tank 1004 may store or provide additional or supplemental liquid helium for the second tank 1006.

FIG. 10-D illustrates a perspective view of the second reservoir 1106a according to some embodiments of the present disclosure. The second reservoir 1106a may include a cavity formed by a torus 1108a wrapping at least partially around the bucking coil former 1102a. The torus 1108a may have a rectangular cross section. The torus may have a C-shape, and the C-shape may have an opening angle. In some embodiments, the opening angle of the reservoir 1106a may be approximately 60 degree. The material of the torus 1108a may include copper, aluminum, stainless steel, or a composite thereof, or the like, or a combination thereof. The bucking coil former 1102a and the torus 1108a may be connected by a fixed head 1302a. The fixed head 1302a may be made of, e.g., copper, aluminum, stainless steel, or the like, or an alloy thereof, or a combination thereof. The fixed head 1302a may pass through the second reservoir 1106a and be attached to the support structure 1104. The material of the support structure 1104 may include, e.g., copper, aluminum, stainless steel, or the like, or an alloy thereof, or a combination thereof. The fixed head 1302a and the second reservoir 1106a may be welded together. The fixed head 1302a and the support structure 1104 may be bolted together or welded together.

As illustrated in FIG. 10-E, the chamber 1015 may be in fluid communication with the first tank 1003 (illustrated in FIG. 10-A) by a tube. A cotton string 1012 stretching from one end of the bellows may connect to a fixed block 1401 in the helium buffering tank 1004. Thus, helium condensed by a refrigerator 1016 may flow back to the helium buffering tank 1004.

The invention claimed is:

1. A cryostat comprising:
a tank configured to accommodate a volume of a first cryogen;
a displacer disposed within the tank and configured to displace the first cryogen, the displacer enclosing a cavity configured to accommodate a second cryogen, and a wall of the displacer being configured to isolate the second cryogen from the first cryogen;
a first tube having a first end connected to the cavity and a second end connected to an interior of the tank, the first tube enabling fluid communication between the cavity and the tank; and
at least one second tube extending from the cavity to an exterior of the tank, the second tube enabling fluid communication between the cavity and the exterior of the tank.

2. The cryostat of claim 1, wherein the second end of the first tube is located above a cryogen fill level of the first cryogen in the tank.

3. The cryostat of claim 1, wherein the at least one second tube includes a third end connected to the cavity and a fourth end connected to the exterior of the tank, and the fourth end of the second tube is in thermal connection with a cryocooler.

4. The cryostat of claim 1, wherein the first cryogen is the same as the second cryogen.

5. The cryostat of claim 1, wherein the tank includes two end walls and a side wall, and the displacer is formed by inserting through two holes located on the side wall of the tank.

6. The cryostat of claim 1, wherein the displacer includes an entrance and an exit, and the cavity is an annular cavity defined by the entrance and the exit.

7. The cryostat of claim 1, wherein the tank has a shape of a cylinder, and an axis of the cavity is perpendicular to an axis of the tank.

8. The cryostat of claim 1, further comprising:
a shielding housing configured to enclose the tank; and
an outer tank configured to enclose the shielding housing, a vacuumed cavity being formed between the tank and the outer tank.

9. The cryostat of claim 1, wherein the tank accommodates a superconducting coil mounted on a coil former.

10. A magnetic resonance imaging system, comprising:
a cryostat comprising:
a tank configured to accommodate a volume of a first cryogen;
a displacer disposed within the tank, at least part of the displacer being immersed in the first cryogen, the displacer enclosing a cavity configured to accommodate a second cryogen, and a wall of the displacer being configured to isolate the second cryogen from the first cryogen;
a first tube having a first end connected to the cavity and a second end connected to an interior of the tank, the first tube enabling fluid communication between the cavity and the tank; and
at least one second tube extending from the cavity to an exterior of the tank, the at least one second tube enabling fluid communication between the cavity and the exterior of the tank; and
a superconducting coil located in the tank, the superconducting coil being configured to generate a static magnetic field.

11. The magnetic resonance imaging system of claim 10, wherein the second end of the first tube is located above a cryogen fill level of the first cryogen in the tank.

12. The magnetic resonance imaging system of claim 11, the cryostat further comprising:
a shielding housing configured to enclose the tank; and
an outer tank configured to enclose the shielding housing, a vacuumed cavity being formed between the tank and the outer tank.

13. The magnetic resonance imaging system of claim 10, wherein a fourth end of the at least one second tube is connected to a cryocooler.

14. The magnetic resonance imaging system of claim 10, wherein the tank includes two end walls and a side wall, and the displacer is formed by-inserting through two holes located on the side wall of the tank.

15. The magnetic resonance imaging system of claim 10, wherein the cavity has an annular shape, the tank has a shape of a cylinder, and an axis of the cavity is perpendicular or parallel to an axis of the tank.

16. A magnetic resonance imaging system, comprising:
a cryostat comprising:
a tank configured to accommodate a volume of a first cryogen;
a displacer disposed within the tank, the displacer enclosing a cavity;
a first tube having a first end extending to one end of the displacer and a second end connected to an interior of the tank; and
a second tube having a third end extending to another end of the displacer and a fourth end connected to an exterior of the tank;
the first end of the first tube and the third end of the second tube spaced apart from each other by the cavity of the displacer; and
a superconducting coil located in the tank, the superconducting coil being configured to generate a static magnetic field.

17. The magnetic resonance imaging system of claim 16, wherein the cavity of the displacer is configured to accommodate a second cryogen.

18. The magnetic resonance imaging system of claim 16, wherein a valve is mounted to the second tube.

19. The magnetic resonance imaging system of claim 16, wherein the tank comprises an outer vacuum tank and an inner tank, the inner tank and the displacer are enclosed by the outer vacuum tank.

20. The magnetic resonance imaging system of claim 19, wherein the displacer is accommodated in the inner tank.

* * * * *